(12) United States Patent
Park et al.

(10) Patent No.: US 11,844,274 B2
(45) Date of Patent: Dec. 12, 2023

(54) ORGANIC ELECTROLUMINESCENCE DEVICE AND COMPOUND FOR ORGANIC ELECTROLUMINESCENCE DEVICE

(71) Applicants: Samsung Display Co., Ltd., Yongin-si (KR); Seoul National University R&DB Foundation, Seoul (KR)

(72) Inventors: SooYoung Park, Seoul (KR); Sehun Kim, Yongin-si (KR); JiEon Kwon, Seoul (KR); Hyojeong Kim, Hwaseong-si (KR); ChiHyun Ryoo, Seoul (KR); Changhee Lee, Seoul (KR); Hyein Jeong, Suwon-si (KR); Jongseok Han, Seoul (KR)

(73) Assignees: Samsung Display Co., Ltd., Yongin-si (KR); Seoul National University R&DB Foundation, Seoul (KR)

( * ) Notice: Subject to any disclaimer, the term of this patent is extended or adjusted under 35 U.S.C. 154(b) by 845 days.

(21) Appl. No.: 16/721,613

(22) Filed: Dec. 19, 2019

(65) Prior Publication Data
US 2020/0321535 A1 Oct. 8, 2020

(30) Foreign Application Priority Data
Apr. 5, 2019 (KR) .......................... 10-2019-0040336

(51) Int. Cl.
*H10K 85/60* (2023.01)
*H10K 50/11* (2023.01)

(52) U.S. Cl.
CPC ....... *H10K 85/6572* (2023.02); *H10K 85/631* (2023.02); *H10K 50/11* (2023.02)

(58) Field of Classification Search
CPC ............ H01L 51/0072; H01L 51/0059; H01L 51/5012; H01L 51/5024; C07D 219/02;
(Continued)

(56) References Cited

U.S. PATENT DOCUMENTS 8,766,248 B2 7/2014 Hotta et al.
10,135,005 B2 11/2018 Yang et al.
(Continued)

FOREIGN PATENT DOCUMENTS

CN 105585577 5/2016
CN 106661001 5/2017
(Continued)

OTHER PUBLICATIONS

Lisi Zhan et al., "A Simple Organic Molecule Realizing Simultaneous TADF, RTP, AIE, Mechanoluminescence: Understanding the Mechanism Behind the Multifunctional Emitter", Angewandte Chemie International Edition, 58(49), 17651-17655 (Oct. 6, 2019). (Year: 2019).*

(Continued)

*Primary Examiner* — Douglas J McGinty
(74) *Attorney, Agent, or Firm* — H.C. Park & Associates, PLC

(57) ABSTRACT

An organic electroluminescence device of an embodiment includes oppositely disposed first electrode and second electrode, and a plurality of organic layers disposed between the first electrode and the second electrode, wherein at least one among the organic layers includes a compound represented by Formula 1 below. Improved emission efficiency and color purity properties may be shown.

Formula 1

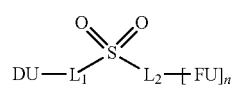

20 Claims, 2 Drawing Sheets

(58) Field of Classification Search
CPC .. C07D 209/86; C07D 209/82; C07D 219/00; C07D 401/12; C09K 11/06; C09K 2211/1007; C09K 2211/1029; H10K 85/6572; H10K 85/631; H10K 50/11; H10K 2101/20; H10K 50/12
USPC ........................................................ 428/690
See application file for complete search history.

(56) References Cited

U.S. PATENT DOCUMENTS

| | | | |
|---|---|---|---|
| 10,290,824 | B2 | 5/2019 | Nakanotani et al. |
| 2016/0133856 | A1* | 5/2016 | Yang ................... H10K 85/40 546/102 |
| 2017/0309857 | A1* | 10/2017 | Nakanotani ............ C09K 11/06 |
| 2018/0205019 | A1* | 7/2018 | Fuchiwaki ........... C07D 413/14 |
| 2018/0237460 | A1* | 8/2018 | Ahn ..................... C07D 405/04 |
| 2018/0269408 | A1* | 9/2018 | Yang ................... C07D 471/04 |
| 2019/0027683 | A1 | 1/2019 | Zysman-Colman et al. |
| 2019/0027693 | A1* | 1/2019 | Zysman-Colman ........................ H01L 51/0072 |
| 2019/0190912 | A1 | 6/2019 | de Boer et al. |

FOREIGN PATENT DOCUMENTS

| | | |
|---|---|---|
| CN | 107112421 | 8/2017 |
| CN | 108264521 | 7/2018 |
| CN | 109422756 | 3/2019 |
| KR | 10-1571589 | 11/2015 |
| KR | 10-2017-0010715 | 2/2017 |
| KR | 10-2018-0067243 | 6/2018 |
| KR | 10-2018-0085860 | 7/2018 |
| KR | 10-2018-0097806 | 9/2018 |
| KR | 10-2018-0098651 | 9/2018 |
| WO | 2012035853 | 3/2012 |

OTHER PUBLICATIONS

CAS reg. No. 2471972-87-7, Sep. 3, 2020. (Year: 2020).*

"Highly-Efficient Doped and Nondoped Organic Light-Emitting Diodes with External Quantum Efficiencies over 20% from a Multifunctional Green Thermally Activated Delayed Fluorescence Emitter" by Juan Zhao et al in 'The Journal of Physical Chemistry' (p. 1015-1020).

* cited by examiner

ORGANIC ELECTROLUMINESCENCE DEVICE AND COMPOUND FOR ORGANIC ELECTROLUMINESCENCE DEVICE

CROSS-REFERENCE TO RELATED APPLICATIONS

This application claims priority from and the benefit of Korean Patent Application No. 10-2019-0040336, filed on Apr. 5, 2019, which is hereby incorporated by reference for all purposes as if fully set forth herein.

BACKGROUND

Field

Exemplary embodiments/implementations of the invention relate generally to an organic electroluminescence device and a compound used in the organic electroluminescence device, and more specifically, to a compound used as a light-emitting material and an organic electroluminescence device including the same.

DISCUSSION OF THE BACKGROUND

Recently, the development of an organic electroluminescence display device as an image display device has been pursued. Different from a liquid crystal display device, the organic electroluminescence display device is a so-called self-luminescent display device in which holes and electrons injected from a first electrode and a second electrode recombine in an emission layer, and a light emission material including an organic compound in the emission layer emits light to be used for display.

In the application of an organic electroluminescence device to a display device, a decrease of the driving voltage, and an increase of the light-emitting efficiency and the life of the organic electroluminescence device are required, and developments on materials for an organic electroluminescence device stably attaining these requirements are needed.

In particular, recently, a technique on phosphorescence emission using energy in a triplet state or delayed fluorescence emission using triplet-triplet annihilation (TTA) by which singlet excitons are produced by the collision of triplet excitons is being developed, and development on a material for thermally activated delayed fluorescence (TADF) using the delayed fluorescence phenomenon has been conducted.

The above information disclosed in this Background section is only for understanding of the background of the inventive concepts, and, therefore, it may contain information that does not constitute prior art.

SUMMARY

Devices constructed according to exemplary embodiments of the invention are capable of providing an organic electroluminescence device having improved emission efficiency and color purity, as well as a compound which is capable of increasing the color purity of an organic electroluminescence device.

Additional features of the inventive concepts will be set forth in the description which follows, and in part will be apparent from the description, or may be learned by practice of the inventive concepts.

An exemplary embodiment of the inventive concepts provides an organic electroluminescence device including a first electrode; a second electrode disposed on the first electrode; and a plurality of organic layers disposed between the first electrode and the second electrode, wherein at least one organic layer among the organic layers includes a compound represented by the following Formula 1:

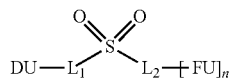

Formula 1

In Formula 1, $L_1$ and $L_2$ are each independently a substituted or unsubstituted arylene group of 6 to 30 carbon atoms for forming a ring, and "n" is 0 or 1. FU is a deuterium atom, a halogen atom, a cyano group, a substituted or unsubstituted alkyl group of 1 to 10 carbon atoms, a substituted or unsubstituted alkoxy group of 1 to 10 carbon atoms, a substituted or unsubstituted aryloxy group of 6 to 30 carbon atoms for forming a ring, a substituted or unsubstituted alkylamine group of 1 to 10 carbon atoms, a substituted or unsubstituted arylamine group of 6 to 30 carbon atoms for forming a ring, a substituted or unsubstituted heterocyclic group of 2 to 30 carbon atoms for forming a ring, or a substituted or unsubstituted aryl group of 6 to 30 carbon atoms for forming a ring. FU and DU are different from each other, and DU is represented by the following Formula 2:

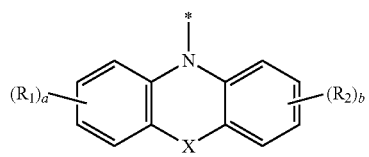

Formula 2

In Formula 2, X is a direct linkage, O, S, or $CR_aR_b$, and $R_a$ and $R_b$ are each independently a hydrogen atom, a deuterium atom, a substituted or unsubstituted alkyl group of 1 to 10 carbon atoms, or a substituted or unsubstituted aryl group of 6 to 30 carbon atoms for forming a ring, or combined with an adjacent group to form a ring. $R_1$ and $R_2$ are each independently a hydrogen atom, a deuterium atom, a halogen atom, a substituted or unsubstituted alkyl group of 1 to 10 carbon atoms, a substituted or unsubstituted alkylamine group of 1 to 10 carbon atoms, a substituted or unsubstituted arylamine group of 6 to 30 carbon atoms for forming a ring, a substituted or unsubstituted aryl group of 6 to 30 carbon atoms for forming a ring, or a substituted or unsubstituted heteroaryl group of 2 to 30 carbon atoms for forming a ring, or combined with an adjacent group to form a ring. "a" and "b" are each independently an integer of 0 to 4.

In an embodiment, the organic layers may include an emission layer; a hole transport region disposed between the first electrode and the emission layer; and an electron transport region disposed between the emission layer and the second electrode, wherein the emission layer may include the compound represented by Formula 1.

In an embodiment, the emission layer may emit delayed fluorescence.

In an embodiment, the emission layer may be a delayed fluorescence emission layer including a host and a dopant, and the dopant may include the compound represented by Formula 1.

In an embodiment, the emission layer may emit blue light.

In an embodiment, Formula 1 may be represented by the following Formula 1-1:

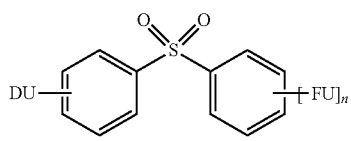

Formula 1-1

In Formula 1-1, "n", FU, and DU are the same as defined in Formula 1.

In an embodiment, Formula 1 may be represented by the following Formula 1-2:

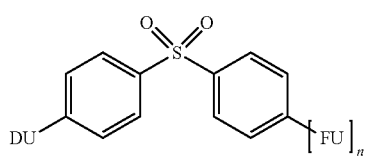

Formula 1-2

In Formula 1-2, "n", FU, and DU are the same as defined in Formula 1.

In an embodiment, Formula 2 may be represented by any one among the following D1 to D5:

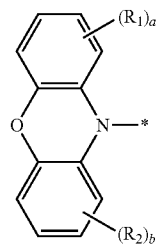

D1

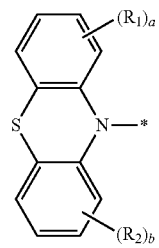

D2

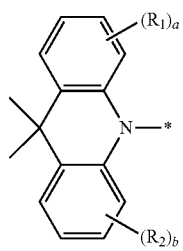

D3

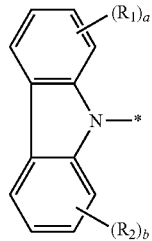

D4

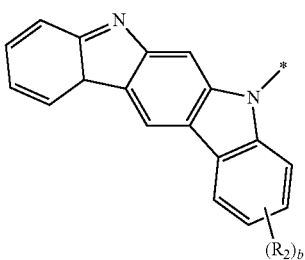

D5

In D1 to D5, $R_1$, $R_2$, "a" and "b" are the same as defined in Formula 2.

In an embodiment, the compound represented by Formula 1 may include at least one among compounds in the following Compound Group 1:

Compound Group 1

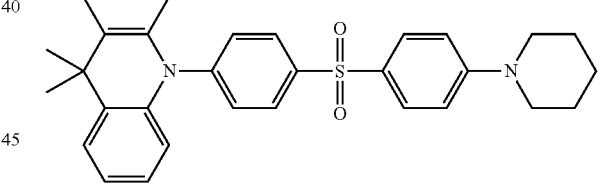

1

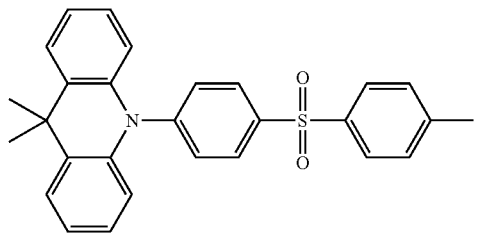

2

3

-continued

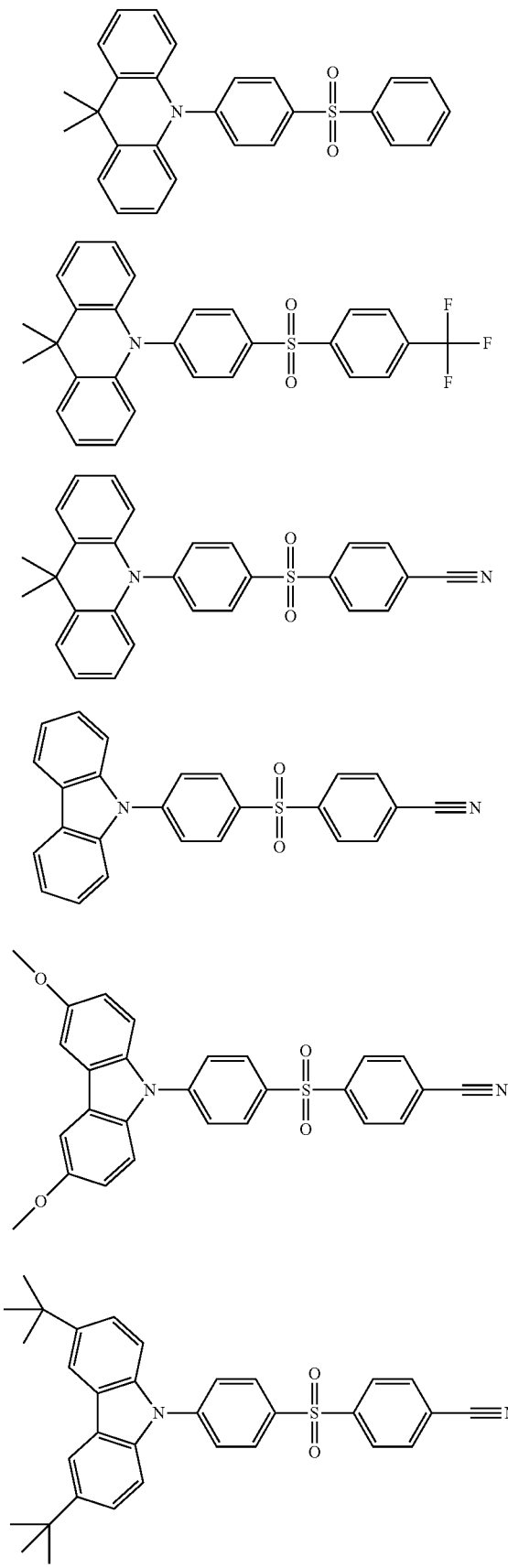

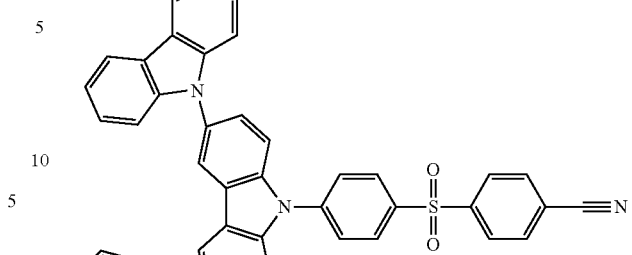

In an embodiment of the inventive concept, there is provided a compound represented by the following Formula 1:

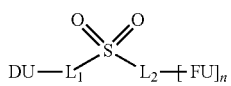

Formula 1

In Formula 1, $L_1$ and $L_2$ are each independently a substituted or unsubstituted arylene group of 6 to 30 carbon atoms for forming a ring, and "n" is 0 or 1. FU is a deuterium atom, a halogen atom, a cyano group, an amino group, a substituted or unsubstituted alkyl group of 1 to 10 carbon atoms, a substituted or unsubstituted alkoxy group of 1 to 10 carbon atoms, a substituted or unsubstituted aryloxy group of 6 to 30 carbon atoms for forming a ring, a substituted or unsubstituted alkylamine group of 1 to 10 carbon atoms, a substituted or unsubstituted arylamine group of 6 to 30 carbon atoms for forming a ring, a substituted or unsubstituted heterocyclic group of 2 to 30 carbon atoms for forming a ring, or a substituted or unsubstituted aryl group of 6 to 30 carbon atoms for forming a ring. FU and DU are different from each other, and DU is represented by the following Formula 2:

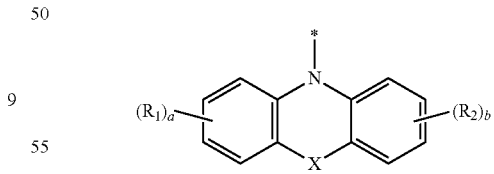

Formula 2

In Formula 2, X is a direct linkage, O, S, or $CR_aR_b$, and $R_a$ and $R_b$ are each independently a hydrogen atom, a deuterium atom, a substituted or unsubstituted alkyl group of 1 to 10 carbon atoms, or a substituted or unsubstituted aryl group of 6 to 30 carbon atoms for forming a ring, or combined with an adjacent group to form a ring. $R_1$ and $R_2$ are each independently a hydrogen atom, a deuterium atom, a halogen atom, a substituted or unsubstituted alkyl group of 1 to 10 carbon atoms, a substituted or unsubstituted alkylamine group of 1 to 10 carbon atoms, a substituted or unsubstituted arylamine group of 6 to 30 carbon atoms for forming a ring, a substituted or unsubstituted aryl group of 6 to 30 carbon atoms for forming a ring, or a substituted or unsubstituted heteroaryl group of 2 to 30 carbon atoms for forming a ring, or combined with an adjacent group to form a ring. "a" and "b" are each independently an integer of 0 to 4.

In an embodiment, $L_1$ and $L_2$ may be the same.

In an embodiment, $L_1$ and $L_2$ may be unsubstituted phenylene groups.

In an embodiment, Formula 1 may be represented by the following Formula 1-1:

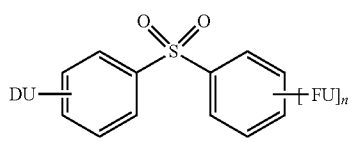

Formula 1-1

In an embodiment, Formula 1 may be represented by the following Formula 1-2:

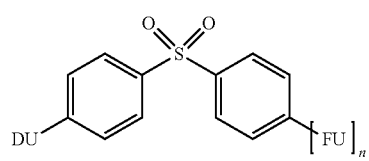

Formula 1-2

In an embodiment, Formula 2 may be represented by any one among the following D1 to D5:

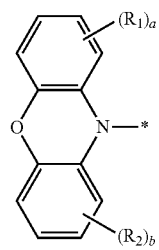

D1

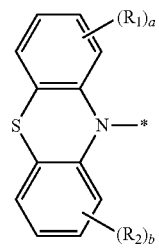

D2

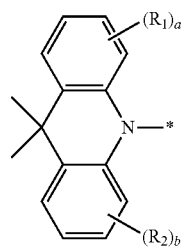

D3

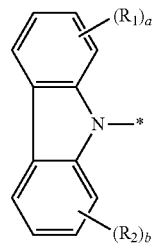

D4

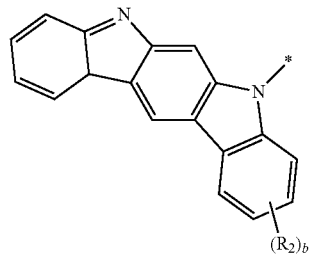

D5

In an embodiment, Formula 1 may be represented by the following Formula 1-3:

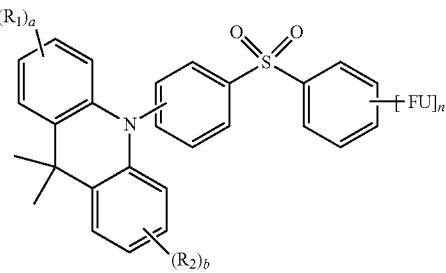

Formula 1-3

In Formula 1-3, "n" and FU are the same as defined in Formula 1, and $R_1$, $R_2$, "a", and "b" are the same as defined in Formula 2.

In an embodiment, the compound represented by Formula 1 may be a thermally activated delayed fluorescence dopant.

In an embodiment, a difference between the lowest triplet excitation energy level and the lowest singlet excitation energy level of the compound represented by Formula 1 may be about 0.2 eV or less.

In an embodiment, the compound represented by Formula 1 may be a light-emitting material which emits light having a central wavelength of about 420 nm to about 480 nm.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
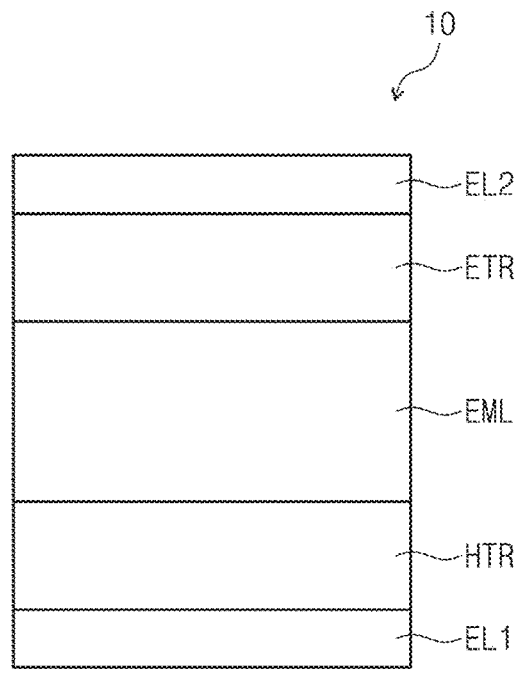
FIG. 1 is a cross-sectional view schematically illustrating an organic electroluminescence device according to an exemplary embodiment of the inventive concepts.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
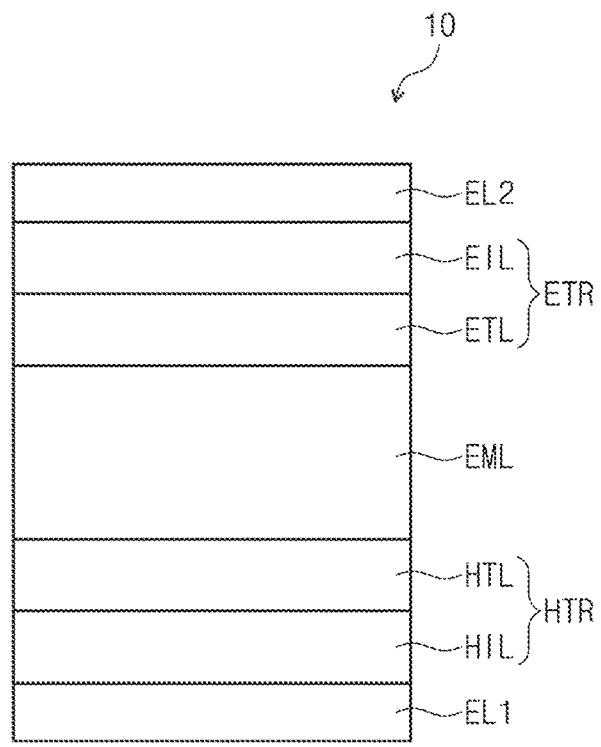
FIG. 2 is a cross-sectional view schematically illustrating an organic electroluminescence device according to an exemplary embodiment of the inventive concepts.
Figure 3:
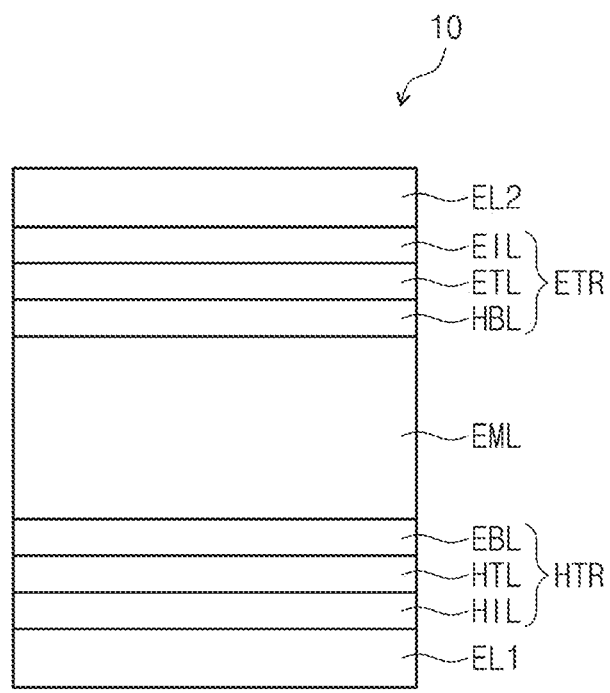
FIG. 3 is a cross-sectional view schematically illustrating an organic electroluminescence device according to an exemplary embodiment of the inventive concepts.

FIGS. 1, 2, and 3 are cross-sectional views schematically illustrating organic electroluminescence devices according to exemplary embodiments of the inventive concepts. Referring to FIGS. 1 to 3, in an organic electroluminescence device 10 of an embodiment, a first electrode EL1 and a second electrode EL2 are oppositely disposed to each other, and between the first electrode EL1 and the second electrode EL2, a plurality of organic layers may be disposed. The plurality of the organic layers may include a hole transport region HTR, an emission layer EML, and an electron transport region ETR. That is, the organic electroluminescence device 10 according to an embodiment may include the first electrode EL1, the hole transport region HTR, the emission layer EML, the electron transport region ETR, and the second electrode EL2, laminated in order. The organic electroluminescence device 10 of an embodiment may include a compound of an embodiment, which will be described later, in at least one organic layer disposed between the first electrode EL1 and the second electrode EL2.

For example, the organic electroluminescence device 10 of an embodiment may include a compound of an embodiment, which will be described later, in the emission layer EML disposed between the first electrode EL1 and the second electrode EL2. However, embodiments of the inventive concepts are not limited thereto, and the organic electroluminescence device 10 of an embodiment may include a compound of an embodiment, which will be described later, in at least one organic layer among a plurality of organic layers disposed between the first electrode EL1 and the second electrode EL2 in addition to the emission layer EML. For example, the organic electroluminescence device 10 of an embodiment may include the compound of an embodiment as an light-emitting material of the emission layer EML, and the compound of an embodiment, which will be described later, may be included in at least one organic layer included in the hole transport region HTR and the electron transport region ETR.

Meanwhile, when compared with FIG. 1, FIG. 2 shows the cross-sectional view of an organic electroluminescence device 10 of an embodiment, wherein a hole transport region HTR includes a hole injection layer HIL and a hole transport layer HTL, and an electron transport region ETR includes an electron injection layer EIL and an electron transport layer ETL. In addition, when compared with FIG. 1, FIG. 3 shows the cross-sectional view of an organic electroluminescence device 10 of an embodiment, wherein a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL.

The first electrode EL1 has conductivity. The first electrode EL1 may be formed using a metal alloy or a conductive compound. The first electrode EL1 may be an anode. Also, the first electrode EL1 may be a pixel electrode. The first electrode EL1 may be a transmissive electrode, a transflective electrode, or a reflective electrode. If the first electrode EL1 is the transmissive electrode, the first electrode EL1 may include a transparent metal oxide such as indium tin oxide (ITO), indium zinc oxide (IZO), zinc oxide (ZnO), and indium tin zinc oxide (ITZO). If the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). Also, the first electrode EL1 may have a structure including a plurality of layers including a reflective layer or a transflective layer formed using the above materials, and a transmissive conductive layer formed using ITO, IZO, ZnO, or ITZO. For example, the first electrode EL1 may include a three layer structure of ITO/Ag/ITO. However, embodiments of the inventive concepts are not limited thereto. The thickness of the first electrode EL1 may be from about 1,000 Å to about 10,000 Å, for example, from about 1,000 Å to about 3,000 Å.

The hole transport region HTR is provided on the first electrode EL1. The hole transport region HTR may include at least one of a hole injection layer HIL, a hole transport layer HTL, a hole buffer layer (not shown), or an electron blocking layer EBL. The thickness of the hole transport region HTR may be, for example, from about 50 Å to about 1,500 Å.

The hole transport region HTR may have a single layer formed using a single material, a single layer formed using a plurality of different materials, or a multilayer structure including a plurality of layers formed using a plurality of different materials.

For example, the hole transport region HTR may have the structure of a single layer such as a hole injection layer HIL, or a hole transport layer HTL, and may have a structure of a single layer formed using a hole injection material and a hole transport material. Alternatively, the hole transport region HTR may have a structure of a single layer formed using a plurality of different materials, or a structure laminated from the first electrode EL1 of hole injection layer HIL/hole transport layer HTL, hole injection layer HIL/hole transport layer HTL/hole buffer layer (now shown), hole injection layer HIL/hole buffer layer (not shown), hole transport layer HTL/hole buffer layer, or hole injection layer HIL/hole transport layer HTL/electron blocking layer EBL, without limitation.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

The hole injection layer HIL may include, for example, a phthalocyanine compound such as copper phthalocyanine; N,N'-diphenyl-N,N'-bis-[4-(phenyl-m-tolyl-amino)-phenyl]-biphenyl-4,4'-diamine (DNTPD), 4,4',4"-tris(3-methylphenylphenylamino)triphenylamine (m-MTDATA), 4,4',4"-tris(N,N-diphenylamino)triphenylamine (TDATA), 4,4',4"-tris{N,N-(2-naphthyl)-N-phenylamino}triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalen-1-yl)-N,N'-diphenyl-benzidine (NPB), triphenylamine-containing polyether ketone (TPAPEK), 4-isopropyl-4'-methyldiphenyliodonium tetrakis(pentafluorophenyl)borate, dipyrazino[2,3-f:2',3'-h]quinoxaline-2,3,6,7,10,11-hexacarbonitrile (HAT-CN), etc.

The hole transport layer HTL may further include, for example, carbazole derivatives such as N-phenyl carbazole and polyvinyl carbazole, fluorine-based derivatives, N,N'-bis(3-methylphenyl)-N,N'-diphenyl-[1,1-biphenyl]-4,4'-diamine (TPD), triphenylamine-based derivatives such as 4,4',4"-tris(N-carbazolyl)triphenylamine (TCTA), N,N'-di(naphthalen-1-yl)-N,N'-diphenyl-benzidine (NPB), 4,4'-cyclohexylidene bis[N,N-bis(4-methylphenyl)]

benzenamine (TAPC), 4,4'-bis[N,N'-(3-tolyl)amino]-3,3'-dimethylbiphenyl (HMTPD), 1,3-bis(N-carbazolyl)benzene (mCP), etc.

The thickness of the hole transport region HTR may be from about 50 Å to about 10,000 Å, for example, from about 100 Å to about 5,000 Å. The thickness of the hole injection layer HIL may be, for example, from about 30 Å to about 1,000 Å, and the thickness of the hole transport layer HTL may be from about 10 Å to about 1,000 Å. For example, the thickness of the electron blocking layer EBL may be from about 10 Å to about 1,000 Å. If the thicknesses of the hole transport region HTR, the hole injection layer HIL, the hole transport layer HTL and the electron blocking layer EBL satisfy the above-described ranges, satisfactory hole transport properties may be achieved without substantial increase of a driving voltage.

The hole transport region HTR may further include a charge generating material in addition to the above-described materials to improve conductivity. The charge generating material may be dispersed uniformly or non-uniformly in the hole transport region HTR. The charge generating material may be, for example, a p-dopant. The p-dopant may be one of quinone derivatives, metal oxides, or cyano group-containing compounds, without limitation. For example, non-limiting examples of the p-dopant may include quinone derivatives such as tetracyanoquinodimethane (TCNQ) and 2,3,5,6-tetrafluoro-7,7,8,8-tetracyanoquinodimethane (F4-TCNQ), metal oxides such as tungsten oxide and molybdenum oxide, without limitation.

As described above, the hole transport region HTR may further include at least one of a hole buffer layer (not shown) or an electron blocking layer EBL in addition to the hole injection layer HIL and the hole transport layer HTL. The hole buffer layer (not shown) may compensate a resonance distance according to the wavelength of light emitted from the emission layer EML and increase light emission efficiency. Materials included in the hole transport region HTR may be used as materials included in the hole buffer layer (not shown). The electron blocking layer EBL is a layer playing the role of blocking the electron injection from the electron transport region ETR to the hole transport region HTR.

The emission layer EML is provided on the hole transport region HTR. The emission layer EML may have a thickness of, for example, from about 100 Å to about 1,000 Å or from about 100 Å to about 500 Å. The emission layer EML may have a single layer formed using a single material, a single layer formed using a plurality of different materials, or a multilayer structure having a plurality of layers formed using a plurality of different materials.

In the organic electroluminescence device 10 of an embodiment, the emission layer EML may include the compound according to an embodiment.

The compound of an embodiment includes a sulfonyl group ($SO_2$) and may include at least one electron donor which is combined at one side of the sulfonyl group. For example, the compound of an embodiment includes a sulfonyl group and may include a first electron donor which is combined at one side of the sulfonyl group, and a second electron donor which is combined at the other side of the sulfonyl group and different from the first electron donor. In addition, the compound of an embodiment includes a sulfonyl group and may include a first electron donor which is combined at one side of the sulfonyl group, and an electron acceptor which is combined at the other side of the sulfonyl group. Meanwhile, the compound of an embodiment may include the sulfonyl group as an electron acceptor and include an electron donor which is combined at one side of the sulfonyl group.

In the compound of an embodiment, the electron donor may be a heterocyclic compound with three or more rings which include a nitrogen (N) atom as a ring-forming element. For example, the electron donor may be acridine derivatives, phenothiazine derivatives, phenoxazine derivatives, or carbazole derivatives. However, embodiments of the inventive concepts are not limited thereto.

In addition, in the compound of an embodiment, the electron acceptor may be a cyano group, a substituted or unsubstituted alkyl group, a substituted or unsubstituted alkoxy group, a substituted or unsubstituted aryloxy group, a substituted or unsubstituted amine group, a substituted or unsubstituted heterocyclic group, or a substituted or unsubstituted aryl group, and the sulfonyl group may be the electron acceptor. However, embodiments of the inventive concepts are not limited thereto.

In the description, the term "substituted or unsubstituted" corresponds to substituted or unsubstituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkoxy group, a hydrocarbon ring, an aryl group, and a heterocyclic group. In addition, each of the substituents may be substituted or unsubstituted. For example, a biphenyl group may be interpreted as an aryl group or a phenyl group substituted with a phenyl group.

In the description, the terms "forming a ring by combining adjacent groups with each other" may mean forming a substituted or unsubstituted hydrocarbon ring or a substituted or unsubstituted heterocycle by combining adjacent groups with each other. A hydrocarbon ring may include an aliphatic hydrocarbon ring and an aromatic hydrocarbon ring. The heterocycle may include an aliphatic heterocycle and aromatic heterocycle. The ring formed by combining adjacent groups with each other may be a monocycle or polycycle. In addition, the ring formed by combining adjacent groups may be connected with another ring to form a spiro structure.

In the description, the terms "an adjacent group" may mean a substituent at an atom which is directly connected with another atom at which a corresponding substituent is substituted, another substituent at an atom at which a corresponding substituent is substituted, or a substituent stereoscopically disposed at the nearest position to a corresponding substituent. For example, two methyl groups in 1,2-dimethylbenzene may be interpreted as "adjacent groups", and two ethyl groups in 1,1-diethylcyclopentene may be interpreted as "adjacent groups"

Meanwhile, in the description, the direct linkage may mean a single bond.

In the description, examples of the halogen atom may include a fluorine atom, a chlorine atom, a bromine atom or an iodine atom.

In the description, the alkyl may be a linear, branched or cyclic type. The carbon number of the alkyl may be 1 to 50, 1 to 30, 1 to 20, 1 to 10, or 1 to 6. Examples of the alkyl may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-heneicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the description, the hydrocarbon ring includes an aliphatic hydrocarbon ring and an aromatic hydrocarbon ring. The heterocycle includes an aliphatic heterocycle and an aromatic heterocycle. The hydrocarbon ring and the heterocycle may be a monocycle or a polycycle.

In the description, the hydrocarbon ring may be an optional functional group or substituent derived from an aliphatic hydrocarbon ring, or an optional functional group or substituent derived from an aromatic hydrocarbon ring. The carbon number of the hydrocarbon ring for forming the ring may be 5 to 60.

In the description, the heterocycle may be an optional functional group or substituent derived from a heterocycle including at least one heteroatom as an atom for forming a ring. The carbon number of the heterocycle for forming the ring may be 5 to 60.

In the description, the aryl group means an optional functional group or substituent derived from an aromatic hydrocarbon ring. The aryl group may be a monocyclic aryl group or a polycyclic aryl group. The carbon number for forming a ring in the aryl group may be 6 to 30, 6 to 20, or 6 to 15. Examples of the aryl group may include phenyl, naphthyl, fluorenyl, anthracenyl, phenanthryl, biphenyl, terphenyl, quaterphenyl, quinquephenyl, sexiphenyl, triphenylenyl, pyrenyl, benzofluoranthenyl, chrysenyl, etc., without limitation.

In the description, the fluorenyl group may be substituted, and two substitutents may be combined with each other to form a spiro structure. Examples of the substituted fluorenyl group are as follows. However, embodiments of the inventive concepts are not limited thereto.

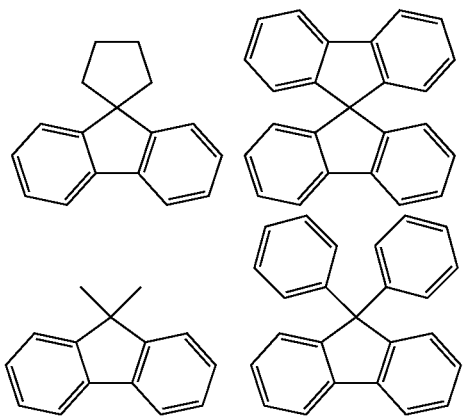

In the description, the heteroaryl group may include at least one of B, O, N, P, Si or S as a heteroatom. If the heteroaryl group includes two or more heteroatoms, the two or more heteroatoms may be the same or different. The heteroaryl group may be a monocyclic heterocycle or a polycyclic heterocycle. The carbon number for forming a ring of the heteroaryl may be 2 to 30, 2 to 20, or 2 to 10. Examples of the heteroaryl group may include thiophene, furan, pyrrole, imidazole, thiazole, oxazole, oxadiazole, triazole, pyridine, bipyridine, pyrimidine, triazine, acridyl, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophene, thienothiophene, benzofuran, phenanthroline, isooxazole, thiadiazole, phenothiazine, dibenzosilole, dibenzofuran, etc., without limitation.

In the present description, the explanation on the aryl may be applied to the arylene, except that the arylene is divalent. The explanation on the heteroaryl may be applied to the heteroarylene, except that the heteroarylene is divalent.

In the description, the oxy group may include an alkoxy group and an aryloxy group. The alkoxy group may be a linear chain, a branched chain or a cyclic chain. The number of the carbon atom of the alkoxy group is not specifically limited, but may be, for example, 1 to or 1 to 10. Examples of the oxy group include methoxy, ethoxy, n-propoxy, isopropoxy, butoxy, pentyloxy, hexyloxy, octyloxy, nonyloxy, decyloxy, benzyloxy, etc., without limitation.

In the description, the carbon number of the amine is not specifically limited, but may be 1 to 30. The amine may include alkylamine and arylamine. Examples of the amine may include methylamine, dimethylamine, phenylamine, diphenylamine, naphthylamine, 9-methyl-anthracenylamine, triphenylamine, etc., without limitation.

In the description, the alkyl group in the alkoxy group and the alkylamine group may be the same as the examples of the above-described alkyl group.

In the description, the aryl group in the aryloxy group and the arylamine group may be the same as the example of the above-described aryl group.

In the description, "-*" means a connecting part.

An emission layer EML of the organic electroluminescence device 10 of an embodiment may include a compound represented by the following Formula 1:

Formula 1

In Formula 1, $L_1$ and $L_2$ are each independently a substituted or unsubstituted arylene group of 6 to 30 carbon atoms for forming a ring. For example, $L_1$ and $L_2$ may be each independently an unsubstituted arylene group of 6 to 30 carbon atoms for forming a ring. In an embodiment, $L_1$ and $L_2$ may be the same. For example, both $L_1$ and $L_2$ may be unsubstituted phenylene groups.

In Formula 1, "n" may be 0 or 1.

In Formula 1, FU may be a deuterium atom, a halogen atom, a cyano group, an amino group, a substituted or unsubstituted alkyl group of 1 to 10 carbon atoms, a substituted or unsubstituted alkoxy group of 1 to 10 carbon atoms, a substituted or unsubstituted aryloxy group of 6 to 30 carbon atoms for forming a ring, a substituted or unsubstituted alkylamine group of 1 to 10 carbon atoms, a substituted or unsubstituted arylamine group of 6 to 30 carbon atoms for forming a ring, a substituted or unsubstituted heterocyclic group of 2 to 30 carbon atoms for forming a ring, or a substituted or unsubstituted aryl group of 6 to 30 carbon atoms for forming a ring.

In Formula 1, DU may be represented by Formula 2. In Formula 1, FU and DU may be different from each other.

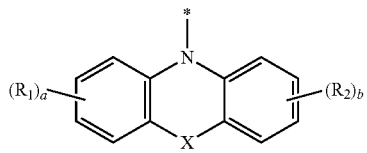

Formula 2

In Formula 2, X may be a direct linkage, O, S, or $CR_aR_b$.

If X is $CR_aR_b$, $R_a$ and $R_b$ may be each independently a hydrogen atom, a deuterium atom, a substituted or unsubstituted alkyl group of 1 to 10 carbon atoms, or a substituted or unsubstituted aryl group of 6 to 30 carbon atoms for forming a ring, or combined with an adjacent group to form a ring. For example, $R_a$ and $R_b$ may be an alkyl group. Particularly, $R_a$ and $R_b$ may be a methyl group.

In Formula 2, $R_1$ and $R_2$ may be each independently a hydrogen atom, a deuterium atom, a halogen atom, a substituted or unsubstituted alkyl group of 1 to 10 carbon atoms, a substituted or unsubstituted alkylamine group of 1 to 10 carbon atoms, a substituted or unsubstituted arylamine group of 6 to 30 carbon atoms for forming a ring, a substituted or unsubstituted aryl group of 6 to 30 carbon atoms for forming a ring, or a substituted or unsubstituted heteroaryl group of 2 to 30 carbon atoms for forming a ring, or combined with an adjacent group to form a ring.

In Formula 2, "a" and "b" may be each independently an integer of 0 to 4. If "a" is an integer of 2 or more, a plurality of $R_1$ groups may be the same or at least one thereof may be different from the remainder. In addition, if "b" is an integer of 2 or more, a plurality of $R_2$ groups may be the same or at least one thereof may be different from the remainder.

DU represented by Formula 2 may be an electron donor. DU may be a substituted or unsubstituted phenoxazine derivative, a substituted or unsubstituted phenothiazine derivative, a substituted or unsubstituted acridine derivative, a substituted or unsubstituted carbazole derivative, or a substituted or unsubstituted indolocarbazole derivative.

Formula 2 may be represented by any one among the following D1 to D5:

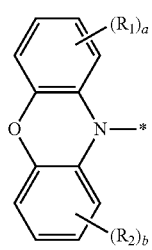

D1

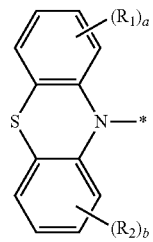

D2

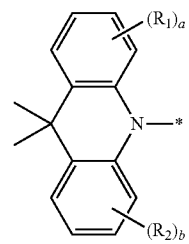

D3

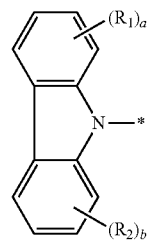

D4

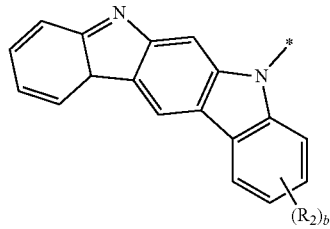

D5

D1 to D3 are cases where X in Formula 2 is O, S or $C(CH_3)_2$, and D4 and D5 are cases where X is a direct linkage. Meanwhile, D5 represents a case where a plurality of $R_1$ groups are combined with each other to form an indole ring.

Meanwhile, in D1 to D5, with respect to $R_1$, $R_2$, "a" and "b", the same explanation thereabout referring to Formula 2 may be applied.

In the compound represented by Formula 1, with respect to a sulfonyl group ($SO_2$), an electron donor represented by "DU" is combined and provided at one side, and a functional part represented by "FU" is combined and provided at the other side. "FU" may be an electron donor or an electron acceptor. Meanwhile, FU may be omitted from the compound represented by Formula 1, and in this case, DU may be an electron donor and the sulfonyl group may be an electron acceptor.

That is, the compound of an embodiment, represented by Formula 1 may be a thermally activated delayed fluorescence emitting material including at least one electron donor and at least one electron acceptor in one molecule.

Meanwhile, the compound represented by Formula 1 may show an asymmetric compound structure, in which DU and FU, which are combined at both sides of the sulfonyl group, show different structures, or FU is omitted. That is, the compound of an embodiment introduces substituents so that both sides of the sulfonyl group have an asymmetric structure, and thus, the functions of an electron donor and an electron acceptor are relatively controlled to control the energy level of the entire compound. Since the compound of an embodiment has a controlled energy level, if used as a material for an emission layer EML, the color purity of an organic electroluminescence device may be improved.

Formula 1 may be represented by the following Formula 1-1:

Formula 1-1

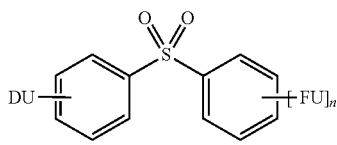

In Formula 1-1, with respect to "n", FU, and DU, the same explanation referring to Formula 1 may be applied. Formula 1-1 represents a case where unsubstituted phenylene groups are included as linkers between the sulfonyl group and DU, and between the sulfonyl group and FU. Meanwhile, if "n" is 0 in Formula 1-1, FU may be omitted.

Formula 1 may be represented by the following Formula 1-2:

Formula 1-2

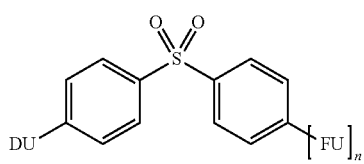

In Formula 1-2, with respect to "n", FU, and DU, the same explanation referring to Formula 1 may be applied. The compound represented by Formula 1-2 corresponds to a case where the sulfonyl group and DU are combined at a para position and the sulfonyl group and FU are combined at a para position in a linker, i.e., a phenylene group.

Meanwhile, Formula 1 may be represented by the following Formula 1-3:

Formula 1-3

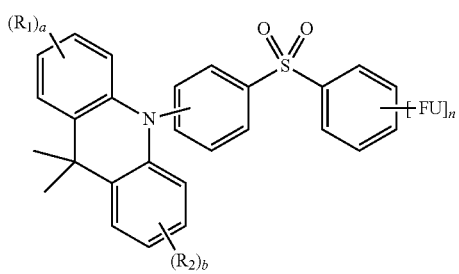

The compound represented by Formula 1-3 may be a case where DU in Formula 1 is an acridine derivative. That is, Formula 1-3 represents a case where DU in Formula 1 is represented by D3.

Meanwhile, in Formula 1-3, the same explanation on "n" and FU referring to Formula 1 may be applied, and the same explanation on $R_1$, $R_2$, "a" and "b" referring to Formula 2 may be applied.

The compound of an embodiment may be any one among the compounds represented in Compound Group 1. The organic electroluminescence device 10 of an embodiment may include at least one compound among the compounds represented in Compound Group 1 in the emission layer EML.

Compound Group 1

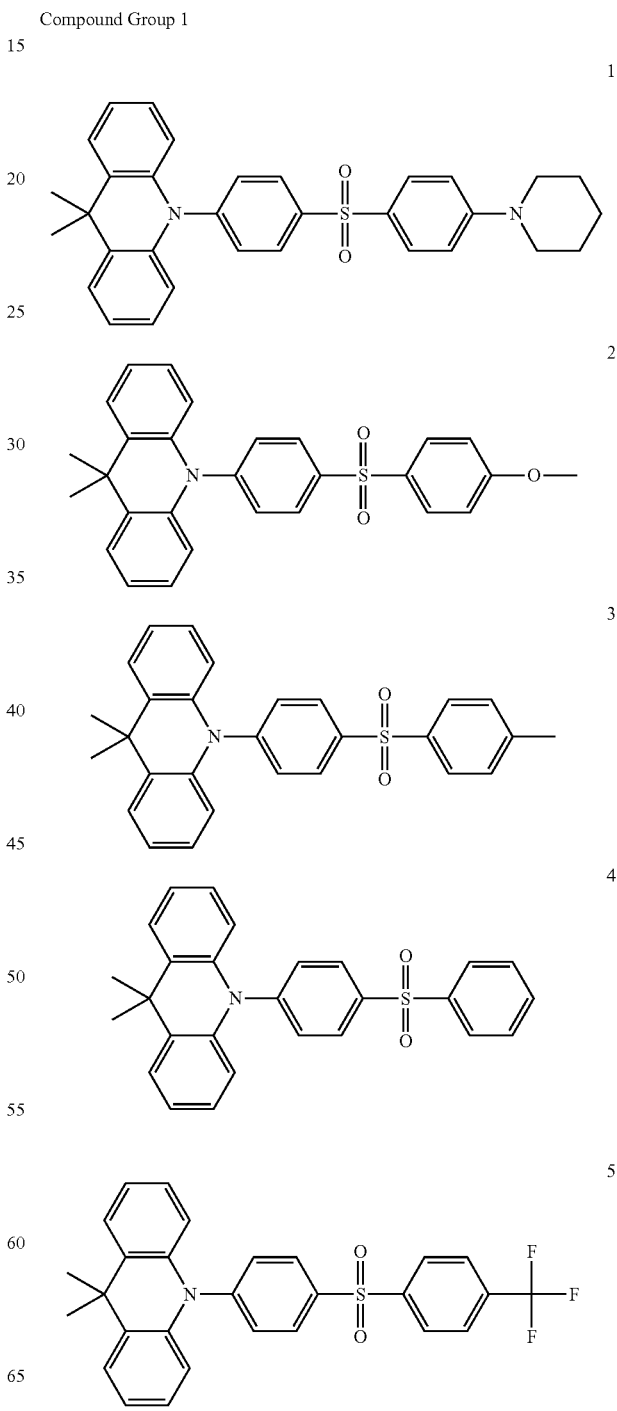

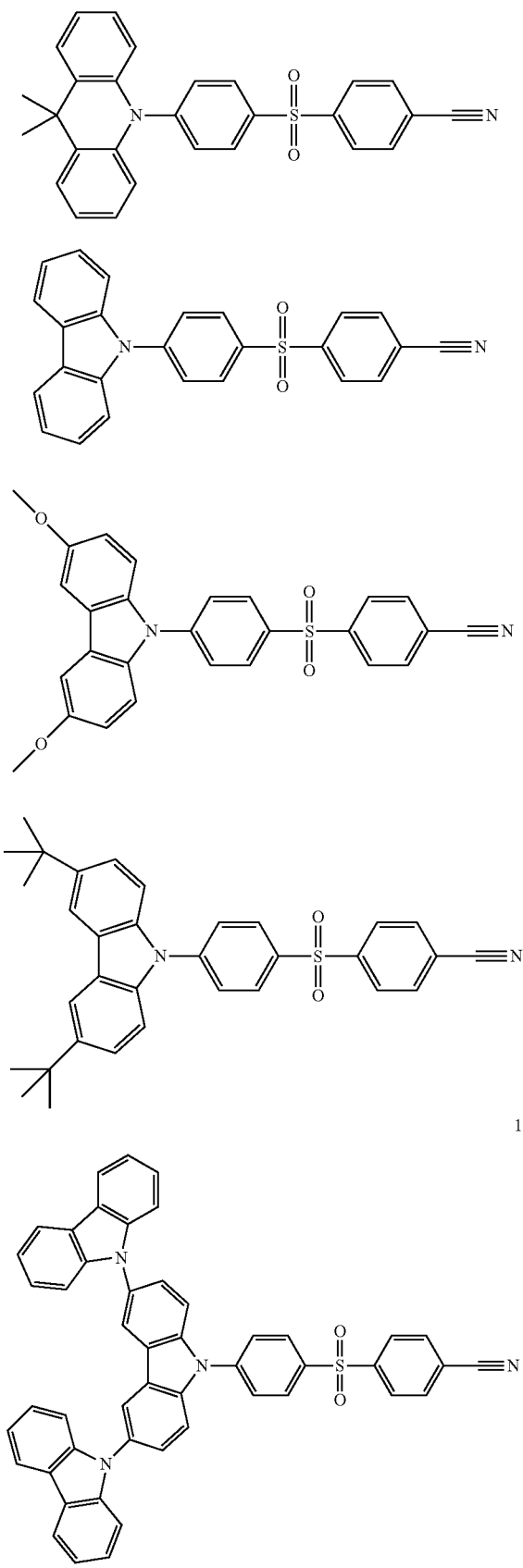

The compound of an embodiment, represented by Formula 1 may be a thermally activated delayed fluorescence emitting material. In addition, the compound of an embodiment, represented by Formula 1 may be a thermally activated delayed fluorescent dopant having a difference ($\Delta E_{ST}$) between the lowest triplet excitation energy level (T1 level) and the lowest singlet excitation energy level (S1 level) of about 0.2 eV or less. For example, $\Delta E_{ST}$ of the compound of an embodiment, represented by Formula 1 may be about 0.1 eV or less.

The compound of an embodiment, represented by Formula 1 may be a light-emitting material having a light-emitting central wavelength in a wavelength region of about 420 nm to about 480 nm. For example, the compound of an embodiment, represented by Formula 1 may be a light-emitting material having a light-emitting central wavelength in a wavelength region of about 430 nm to about 470 nm. The compound of an embodiment, represented by Formula 1 may be a blue thermally activated delayed fluorescent dopant.

In the organic electroluminescence device 10 of an embodiment, the emission layer EML may emit delayed fluorescence. For example, the emission layer EML may emit thermally activated delayed fluorescence (TADF).

In addition, the emission layer EML of the organic electroluminescence device 10 may emit blue light. For example, the emission layer EML of the organic electroluminescence device 10 may emit blue light in a wavelength region of about 480 nm or more. However, embodiments of the inventive concepts are not limited thereto, and the emission layer EML may emit red light or green light.

Meanwhile, though not shown in drawings, the organic electroluminescence device 10 of an embodiment may include a plurality of emission layers. The plurality of emission layers may be laminated one by one and provided. For example, the organic electroluminescence device 10 including the plurality of emission layers may emit white light. The organic electroluminescence device including the plurality of emission layers may be an organic electroluminescence device having a tandem structure. If the organic electroluminescence device 10 includes a plurality of emission layers, at least one emission layer EML may include the above-described compound represented by Formula 1.

In an embodiment, the emission layer EML includes a host and a dopant, and may include the compound of an embodiment as a dopant. For example, in the organic electroluminescence device 10 of an embodiment, the emission layer EML may include a host for emitting delayed fluorescence and a dopant for emitting delayed fluorescence, and may include the compound of an embodiment as the dopant for emitting delayed fluorescence. The emission layer EML may include at least one of the compounds represented in Compound Group 1 as a thermally activated delayed fluorescent dopant.

In an embodiment, the emission layer EML is a delayed fluorescence emission layer, and the emission layer EML may include a known host material and the above-described compound of an embodiment. For example, in an embodiment, the compound of an embodiment may be used as a TADF dopant.

Meanwhile, in an embodiment, the emission layer EML may include a known host material. For example, in an embodiment, the emission layer EML may include as the host material, tris(8-hydroxyquinolinolato)aluminum (Alq$_3$), 4,4'-bis(N-carbazolyl)-1,1'-biphenyl (CBP), poly(N-vinylcabazole) (PVK), 9,10-di(naphthalene-2-yl)anthracene (ADN), 4,4',4''-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), bis[2-(diphenylphosphino)phenyl] ether oxide (DPEPO), hexaphenyl cyclotriphosphazene (CP1), 1,4-bis(triphenylsilyl)benzene (UGH2), hexaphenylcyclotrisiloxane (DPSiO$_3$), octaphenylcyclotetra siloxane (DPSiO$_4$), 2,8-bis(diphenylphosphoryl)dibenzofuran (PPF), 3,3'-bis(N-carbazolyl)-1,1'-biphenyl (mCBP), 1,3-bis(N-carbazolyl)benzene (mCP), etc. However, embodiments of the inventive concepts are not limited thereto, and known host materials for emitting delayed fluorescence may be included in addition to the suggested host materials.

Meanwhile, in the organic electroluminescence device 10 of an embodiment, the emission layer EML may further include known dopant materials. In an embodiment, the emission layer EML may further include as the dopant, styryl derivatives (for example, 1,4-bis[2-(3-N-ethylcarbazolyl)vinyl]benzene (BCzVB), 4-(di-p-tolylamino)-4'-[(di-p-tolylamino)styryl] stilbene (DPAVB), and N-(4-((E)-2-(6-((E)-4-(diphenylamino)styryl)naphthalen-2-yl)vinyl)phenyl)-N-phenylbenzenamine (N-BDAVBi)), perylene and the derivatives thereof (for example, 2,5,8,11-Tetra-t-butylperylene (TBP)), pyrene and the derivatives thereof (for example, 1,1-dipyrene, 1,4-dipyrenylbenzene, and 1,4-bis(N,N-diphenylamino)pyrene), etc.

In the organic electroluminescence devices 10 of exemplary embodiments shown in FIGS. 1 to 3, an electron transport region ETR is provided on an emission layer EML. The electron transport region ETR may include at least one of an hole blocking layer HBL, an electron transport layer ETL or an electron injection layer EIL. However, embodiments of the inventive concepts are not limited thereto.

The electron transport region ETR may have a single layer formed using a single material, a single layer formed using a plurality of different materials, or a multilayer structure having a plurality of layers formed using a plurality of different materials.

For example, the electron transport region ETR may have a single layer structure of an electron injection layer EIL or an electron transport layer ETL, or a single layer structure formed using an electron injection material and an electron transport material. Further, the electron transport region ETR may have a single layer structure having a plurality of different materials, or a structure laminated from the emission layer EML of electron transport layer ETL/electron injection layer EIL, or hole blocking layer HBL/electron transport layer ETL/electron injection layer EIL, without limitation. The thickness of the electron transport region ETR may be, for example, from about 200 Å to about 1,500 Å.

The electron transport region ETR may be formed using various methods such as a vacuum deposition method, a spin coating method, a cast method, a Langmuir-Blodgett (LB) method, an inkjet printing method, a laser printing method, and a laser induced thermal imaging (LITI) method.

If the electron transport region ETR includes an electron transport layer ETL, the electron transport region ETR may include and anthracene-based compound. The electron transport region ETR may include, for example, tris(8-hydroxyquinolinato)aluminum (Alq$_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazol-1-yl)phenyl)-9,10-dinaphthylanthracene, 1,3,5-tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate (Bebq2), 9,10-di(naphthalene-2-yl)anthracene (ADN), or a mixture thereof, without limitation. The thickness of the electron transport layer ETL may be from about 100 Å to about 1,000 Å, for example, from about 150 Å to about 500 Å. If the thickness of the electron transport layer ETL satisfies the above-described range, satisfactory electron transport properties may be obtained without substantial increase of a driving voltage.

If the electron transport region ETR includes the electron injection layer EIL, the electron transport region ETR may include LiF, 8-hydroxyquinolinolato-lithium (LiQ), Li$_2$O, BaO, NaCl, CsF, a metal in lanthanoides such as Yb, or a metal halide such as RbCl and RbI. However, embodiments of the inventive concepts are not limited thereto. The electron injection layer EIL may be also formed using a mixture material of an electron transport material and an insulating organo metal salt. The organo metal salt may be a material having an energy band gap of about 4 eV or more. Particularly, the organo metal salt may include, for example, metal acetates, metal benzoates, metal acetoacetates, metal acetylacetonates, or metal stearates. The thickness of the electron injection layer EIL may be from about 1 Å to about 100 Å, and from about 3 Å to about 90 Å. If the thickness of the electron injection layer EIL satisfies the above described range, satisfactory electron injection properties may be obtained without inducing substantial increase of a driving voltage.

The electron transport region ETR may include a hole blocking layer HBL as described above. The hole blocking layer HBL may include, for example, at least one of 2,9-dimethyl-4,7-diphenyl-1,10-phenanthroline (BCP), or 4,7-diphenyl-1,10-phenanthroline (Bphen). However, embodiments of the inventive concepts are not limited thereto.

The second electrode EL2 is provided on the electron transport region ETR. The second electrode EL2 may be a common electrode or an cathode. The second electrode EL2 may be a transmissive electrode, a transflective electrode or a reflective electrode. If the second electrode EL2 is the transmissive electrode, the second electrode EL2 may include a transparent metal oxide, for example, ITO, IZO, ZnO, ITZO, etc.

If the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). The second electrode EL2 may have a multilayered structure including a reflective layer or a transflective layer formed using the above-described materials and a transparent conductive layer formed using ITO, IZO, ZnO, ITZO, etc.

Though not shown, the second electrode EL2 may be connected with an auxiliary electrode. If the second electrode EL2 is connected with the auxiliary electrode, the resistance of the second electrode EL2 may decrease.

Meanwhile, though not shown, on the second electrode EL2 of the organic electroluminescence device 10 of an embodiment, a capping layer (not shown) may be further disposed. The capping layer (not shown) may include, for example, α-NPD, NPB, TPD, m-MTDATA, Alq$_3$, CuPc, N4,N4,N4',N4'-tetra(biphenyl-4-yl)biphenyl-4,4'-diamine (TPD15), 4,4',4''-tris(carbazol-9-yl) triphenylamine) (TCTA), N,N'-bis(naphthalen-1-yl), etc.

The organic electroluminescence device 10 according to an embodiment of the inventive concept may include the emission layer EML which is disposed between the first electrode EL1 and the second electrode EL2 and may show good emission efficiency and excellent color purity properties. In addition, the compound according to an embodiment may be a thermally activated delayed fluorescence dopant, and the emission layer EML may include the compound of an embodiment to emit thermally activated delayed fluorescence, to show excellent emission efficiency properties in a blue wavelength region.

Meanwhile, the compound of an embodiment may be included as a material for the organic electroluminescence device 10 in an organic layer other than the emission layer EML. For example, the organic electroluminescence device 10 according to an embodiment of the inventive concept may include the compound of an embodiment in at least one organic layer disposed between the first electrode EL1 and the second electrode EL2, or a capping layer (not shown) disposed on the second electrode EL2.

The compound of an embodiment includes at least one electron donor and at least one electron acceptor, and includes both the electron donor and the electron acceptor in one molecule so that electron movement in a molecule may become easy. In addition, the compound of an embodiment introduces an electron donor or an electron acceptor into FU which is a functional part, and the degree of electron donating properties and electron accepting properties in one molecule may be controlled and the wavelength region of emitted light may be controlled. That is, in the compound of an embodiment, substituents are introduced so that both sides of a sulfonyl group have an asymmetric structure, and the function of the electron donor and the electron acceptor is relatively controlled to control the energy level in the entire compound. Thus, if the compound is used as a light-emitting material, the color purity of emitted light may be improved. Hereinafter, the compound according to an embodiment of the inventive concept and the organic electroluminescence device of an embodiment will be particularly explained referring to particular embodiments and comparative embodiments. In addition, the following embodiments are only illustrations to assist the understanding of the inventive concept, and the scope of the inventive concept is not limited thereto.

EXAMPLES

1. Synthesis of Compounds

First, the synthetic method of the compound according to an embodiment will be particularly explained referring to the synthetic methods of Compound 1 to Compound 6. In addition, the following synthetic methods of the compounds are only embodiments, and the synthetic method of the compound according to embodiments of the inventive concepts are not limited thereto.

(1) Synthesis of Compound 1

Compound 1 according to an embodiment may be synthesized, for example, by the following Reaction 1:

Reaction 1

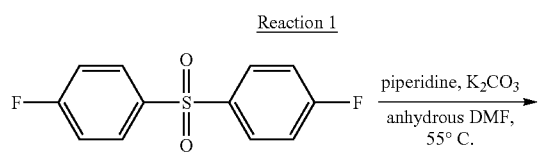

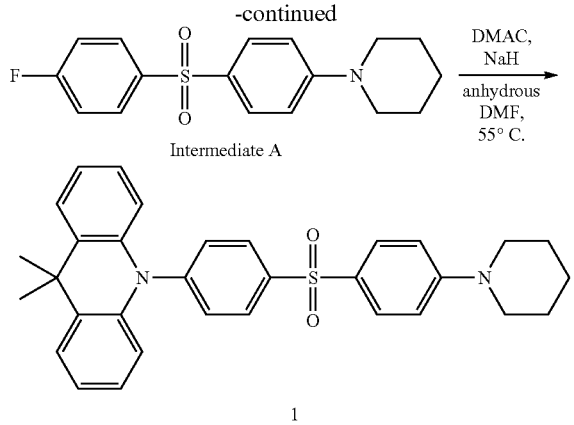

(Synthesis of Intermediate A)

Bis(4-fluorophenyl) sulfone (12.2 mmol), potassium carbonate (12.2 mmol), and piperidine (12.2 mmol) were put in a round-bottom flask, and the flask was charged with an argon (Ar) gas. Anhydrous DMF (20 ml) was used as a solvent, and the round-bottom flask was heated and refluxed while stirring at about 55° C. for about 12 hours. After finishing the reaction, the reaction solution was poured into water, and an organic material was extracted with methylene chloride and separated by column chromatography to obtain a target material, Intermediate A (1-(4-((4-fluorophenyl)sulfonyl)phenyl)piperidine).

(Synthesis of Compound 1)

Dimethylacridine (9.39 mmol) and NaH (10.33 mmol) were put in a round-bottom flask and the flask was charged with an argon gas. Anhydrous DMF (20 ml) was used as a solvent, and the mixture was refluxed while stirring for about 30 minutes. A solution of Intermediate A (9.39 mmol) dissolved in anhydrous DMF (10 ml) was injected to the round-bottom flask and refluxed while stirring at about 55° C. for about 2 hours. After finishing the reaction, the reaction solution was poured into water, and an organic material was extracted with methylene chloride and separated by column chromatography to obtain a target material, Compound 1 as a white solid phase.

(2) Synthesis of Compound 2

Compound 2 according to an embodiment may be synthesized, for example, by the following Reaction 2:

Reaction 2

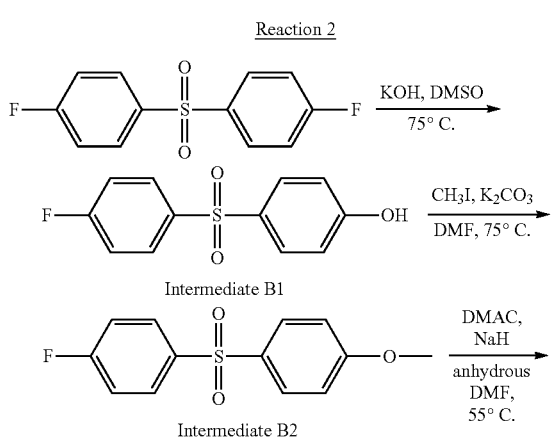

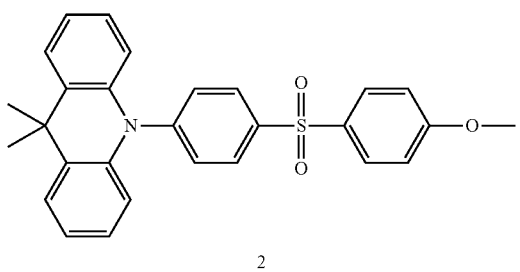

2

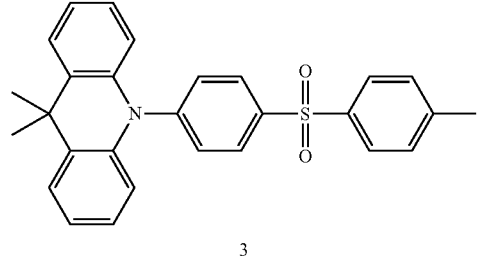

3

(Synthesis of Intermediate B1)

Bis(4-fluorophenyl) sulfone (19.66 mmol) and KOH (39.33 mmol) were dissolved in a DMSO (20 ml) solvent in a round-bottom flask, and the resultant solution was refluxed while stirring at about 75° C. for about 24 hours. After finishing the reaction, the reaction solution was poured into water, and an organic material was extracted with methylene chloride and separated by column chromatography to obtain a target material, Intermediate B1.

(Synthesis of Intermediate B2)

Intermediate B1 (15.85 mmol), CH₃I (15.85 mmol), and potassium carbonate (19.03 mmol) were put in a round-bottom flask, and refluxed while stirring in a DMF (20 ml) solvent at about 75° C. for about 24 hours. After finishing the reaction, the reaction solution was poured into water, and an organic material was extracted with methylene chloride and separated by column chromatography to obtain a target material, Intermediate B2.

(Synthesis of Compound 2)

Dimethylacridine (9.39 mmol), and NaH (10.33 mmol) were put in a round-bottom flask, and the flask was charged with an argon gas. Then, anhydrous DMF (20 ml) was used as a solvent, and the resultant mixture was refluxed while stirring for about 30 minutes. A solution of Intermediate B1 (9.39 mmol) dissolved in anhydrous DMF (10 ml) was injected into the round-bottom flask, and the resultant solution was refluxed while stirring at about 55° C. for about 2 hours. After finishing the reaction, the reaction solution was poured into water, and an organic material was extracted with methylene chloride and separated by column chromatography to obtain a target material, Compound 2 as a white solid phase.

(3) Synthesis of Compound 3

Compound 3 according to an embodiment may be synthesized, for example, by the following Reaction 3:

Reaction 3

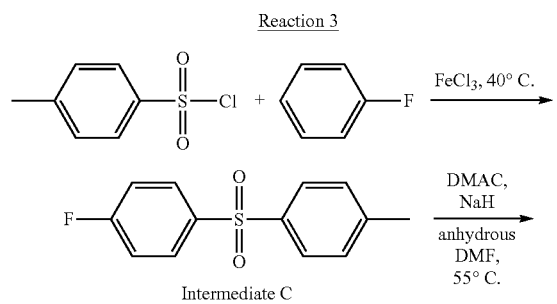

Intermediate C (Synthesis of Intermediate C)

4-methylbenzenesulfonyl chloride (5.24 mmol), and ferric chloride (6.56 mmol) were put in a round-bottom flask, and refluxed while stirring in a fluorobenzene (15.73 mmol) solvent at about 40° C. for about 12 hours. After finishing the reaction, the reaction solution was poured into water, and an organic material was extracted with methylene chloride and separated by column chromatography to obtain a target material, Intermediate C.

(Synthesis of Compound 3)

Dimethylacridine (1.99 mmol) and NaH (2.60 mmol) were put in a round-bottom flask and the flask was charged with an argon gas. Anhydrous DMF (20 ml) was used as a solvent, and the mixture was refluxed while stirring for about 30 minutes. A solution of Intermediate C (1.99 mmol) dissolved in anhydrous DMF (10 ml) was injected to the round-bottom flask and refluxed while stirring at about 55° C. for about 2 hours. After finishing the reaction, the reaction solution was poured into water, and an organic material was extracted with methylene chloride and separated by column chromatography to obtain a target material, Compound 3 as a white solid phase.

(4) Synthesis of Compound 4

Compound 4 according to an embodiment may be synthesized, for example, by the following Reaction 4:

Reaction 4

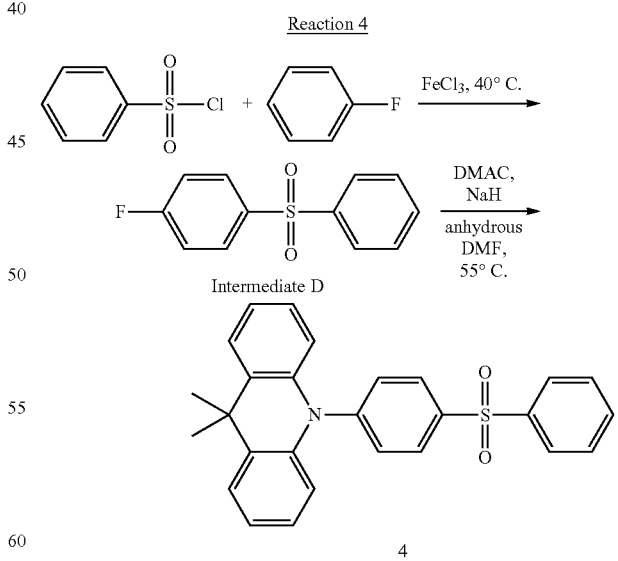

(Synthesis of Intermediate D)

Benzenesulfonyl chloride (28.31 mmol), and ferric chloride (35.39 mmol) were put in a round-bottom flask, and refluxed while stirring in a fluorobenzene (84.93 mmol) solvent at about 40° C. for about 12 hours. After finishing the reaction, the reaction solution was poured into water, and an organic material was extracted with methylene chloride and separated by column chromatography to obtain a target material, Intermediate D.

(Synthesis of Compound 4)

Dimethylacridine (16.08 mmol) and NaH (19.3 mmol) were put in a round-bottom flask and the flask was charged with an argon gas. Anhydrous DMF (20 ml) was used as a solvent, and the mixture was refluxed while stirring for about 30 minutes. A solution of Intermediate D (16.08 mmol) dissolved in anhydrous DMF (10 ml) was injected into the round-bottom flask and refluxed while stirring at about 55° C. for about 2 hours. After finishing the reaction, the reaction solution was poured into water, and an organic material was extracted with methylene chloride and separated by column chromatography to obtain a target material, Compound 4 as a white solid phase.

(5) Synthesis of Compound 5

Compound 5 according to an embodiment may be synthesized, for example, by the following Reaction 5:

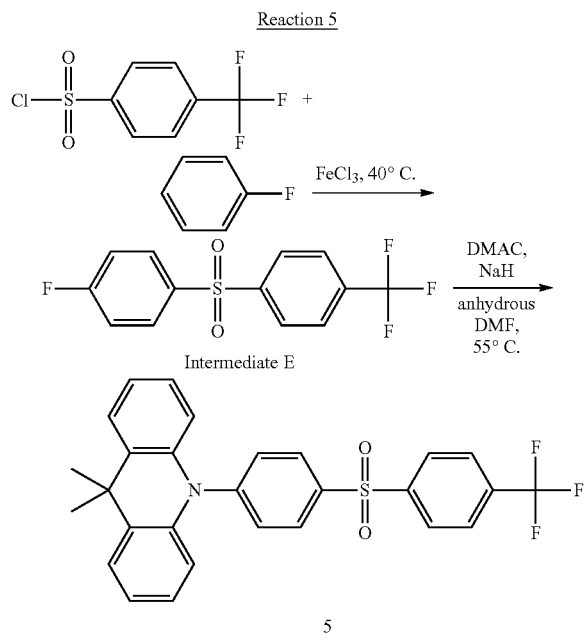

(Synthesis of Intermediate E)

4-(trifluoromethyl)benzenesulfonyl chloride (10.21 mmol), and ferric chloride (12.77 mmol) were put in a round-bottom flask, and refluxed while stirring in a fluorobenzene (30.66 mmol) solvent at about 40° C. for about 12 hours. After finishing the reaction, the reaction solution was poured into water, and an organic material was extracted with methylene chloride and separated by column chromatography to obtain a target material, Intermediate E.

(Synthesis of Compound 5)

Dimethylacridine (15.25 mmol) and NaH (18.30 mmol) were put in a round-bottom flask and the flask was charged with an argon gas. Anhydrous DMF (20 ml) was used as a solvent, and the mixture was refluxed while stirring for about 30 minutes. A solution of Intermediate E (18.30 mmol) dissolved in anhydrous DMF (10 ml) was injected into the round-bottom flask and refluxed while stirring at about 55° C. for about 2 hours. After finishing the reaction, the reaction solution was poured into water, and an organic material was extracted with methylene chloride and separated by column chromatography to obtain a target material, Compound 5 as a white solid phase.

(6) Synthesis of Compound 6

Compound 6 according to an embodiment may be synthesized, for example, by the following Reaction 6:

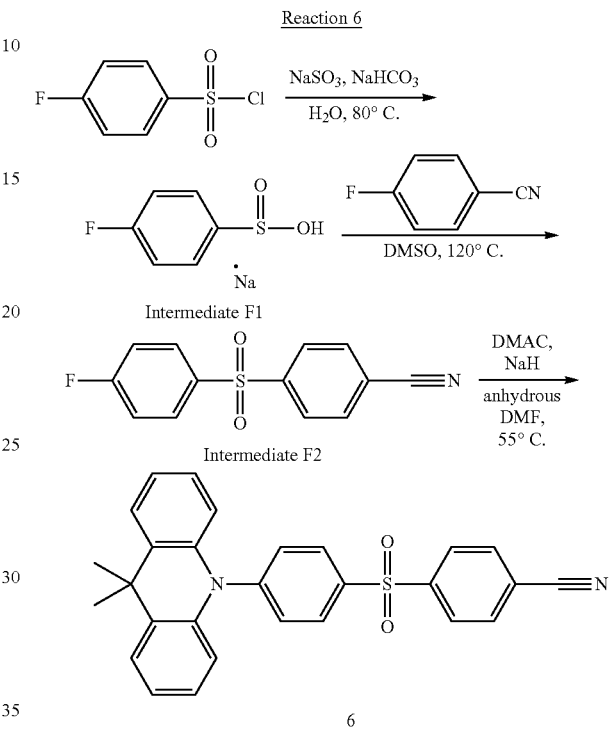

(Synthesis of Intermediate F1)

4-fluorobenzenesulfonyl chloride (48.71 mmol), sodium sulfite (97.42 mmol), and sodium bicarbonate (97.42 mmol) were put in a round-bottom flask and refluxed while stirring in a distilled water (60 ml) as a solvent at about 80° C. for about 4 hours. After finishing the reaction, an organic material was extracted with ethanol and separated by column chromatography to obtain a target material, Intermediate F1.

(Synthesis of Intermediate F2)

4-fluorobenzonitrile (59.23 mmol) was put in a round-bottom flask and refluxed while stirring in a DMSO (20 ml) solvent at about 120° C. Intermediate F1 (19.74 mmol) was dissolved in DMSO (20 ml) and then, the solution was injected into the flask, followed by refluxing while stirring at about 120° C. for about 24 hours. After finishing the reaction, the reaction solution was poured into water, and an organic material was extracted with methylene chloride and separated by column chromatography to obtain a target material, Intermediate F2 as a white solid phase.

(Synthesis of Compound 6)

Dimethylacridine (11.60 mmol) and NaH (12.76 mmol) were put in a round-bottom flask and the flask was charged with an argon gas. Anhydrous DMF (20 ml) was used as a solvent, and the mixture was refluxed while stirring for about 30 minutes. A solution of Intermediate F2 (11.60 mmol) dissolved in anhydrous DMF (10 ml) was injected into the round-bottom flask and refluxed while stirring at about 55° C. for about 2 hours. After finishing the reaction, the reaction solution was poured into water, and an organic material was extracted with methylene chloride and separated by column chromatography to obtain a target material, Compound 6 as a solid phase.

2. Evaluation of Energy Level of Compounds

Compounds 1 to 5 and Comparative Compound C1 are shown in Table 1.

TABLE 1

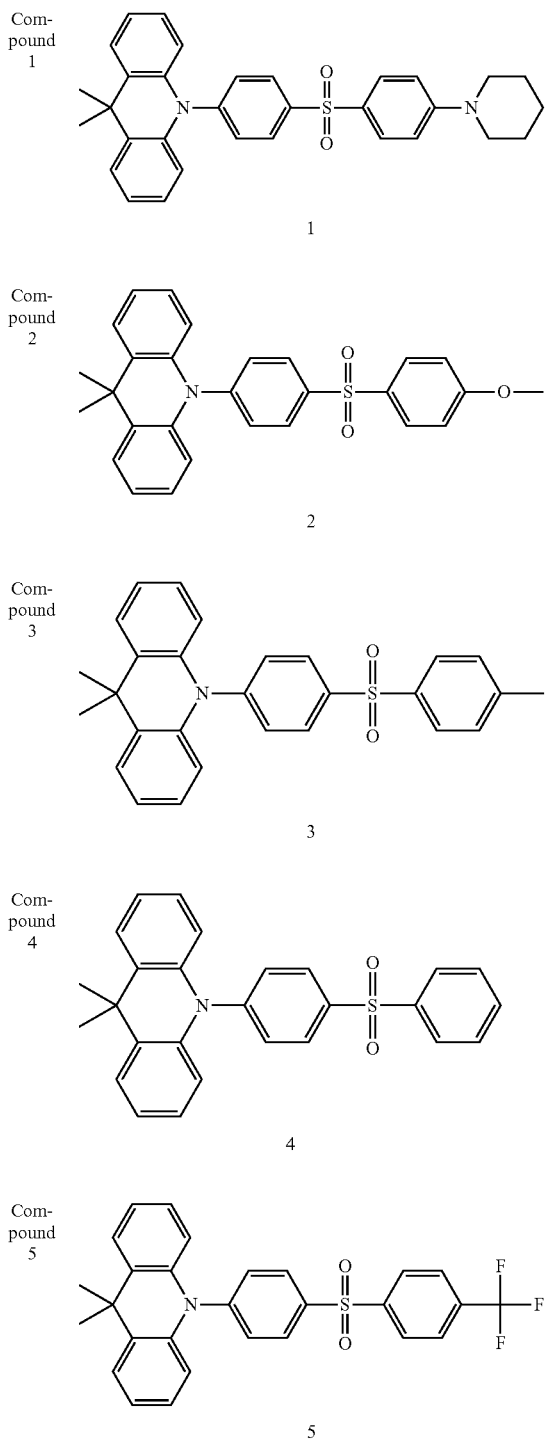

TABLE 1-continued

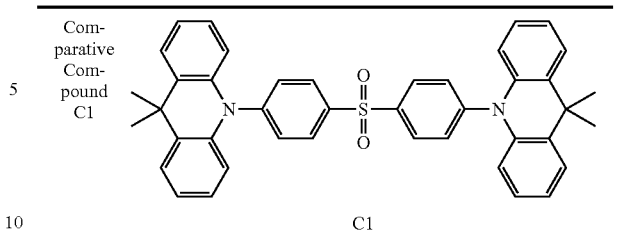

In Table 2 below, the $E_{ST}$ and quantum efficiency ($\Phi_{ab,PL}$) of Example Compounds 1 to 5 and Comparative Compound C1 are shown. The $E_{ST}$ corresponds to a difference between the lowest singlet excitation energy level (S1 level) and the lowest triplet excitation energy level (T1 level). The energy level value of Table 2 was calculated through fluorescence at room temperature and phosphorescence spectrum at a low temperature. The quantum efficiency ($\Phi_{ab,PL}$) corresponds to photoluminescence quantum yield (PLYQ).

TABLE 2

| Kind of Compound | EST (eV) | Φab, PL [%] |
| --- | --- | --- |
| Compound 1 | 0.17 | 50 |
| Compound 2 | 0.12 | 64 |
| Compound 3 | 0.09 | 79 |
| Compound 4 | 0.08 | 88 |
| Compound 5 | 0.06 | 100 |
| Comparative Compound C1 | 0.07 | 92 |

Referring to the results of Table 2, the $E_{ST}$ values of Compound 1 to Compound 5 and Comparative Compound C1 were less than about 0.2 eV and were low. Since Compound 1 to Compound 5 all have small $E_{ST}$ values, the compounds were found to be used as thermally activated delayed fluorescence dopant materials.

Meanwhile, Comparative Compound C1 has a similar $E_{ST}$ value as those of the Example Compounds, and is found to be used as a thermally activated delayed fluorescence dopant material.

Meanwhile, Compound 5 among the Example Compounds is found to show a higher quantum efficiency value than Comparative Compound C1 and other Example Compounds.

3. Manufacture and Evaluation of Organic Electroluminescence Devices Including the Compound of an Embodiment (Manufacture of Organic Electroluminescence Devices)

The organic electroluminescence device of an embodiment, including the compound of an embodiment in an emission layer was manufactured by a method described below. The organic electroluminescence devices of Example 1 to Example 4 were manufactured using Compound 1 to Compound 4, which were the Example Compounds, as the dopant materials of the emission layer. Comparative Example 1 corresponds to an organic electroluminescence device manufactured using Comparative Compound C1 as the dopant material of the emission layer.

ITO was patterned on a glass substrate, and then, was washed with isopropyl alcohol and ultra-pure water, cleaned with ultrasonic waves, exposed to UV for about 30 minutes, and treated with ozone. Then, NPB was deposited to a thickness of about 650 Å to form a hole transport layer.

On the hole transport layer, mCP and the compound of an embodiment of the inventive concept or Comparative Compound C1 were co-deposited to form an emission layer with a thickness of about 300 Å. That is, the emission layer formed by the co-deposition was obtained by mixing Compound 1 to Compound 4 with mCP and depositing in Example 1 to Example 4, and by mixing mCP with Comparative Compound C1 and depositing in Comparative Example 1.

On the emission layer, an electron transport layer was formed using TPBi into a thickness of about 300 Å, and then, LiF was deposited to a thickness of about 10 Å to form an electron injection layer. On the electron injection layer, a second electrode was formed using aluminum (Al) to a thickness of about 1,000 Å.

The compounds used for the manufacture of the organic electroluminescence devices in the Examples and the Comparative Example are shown below.

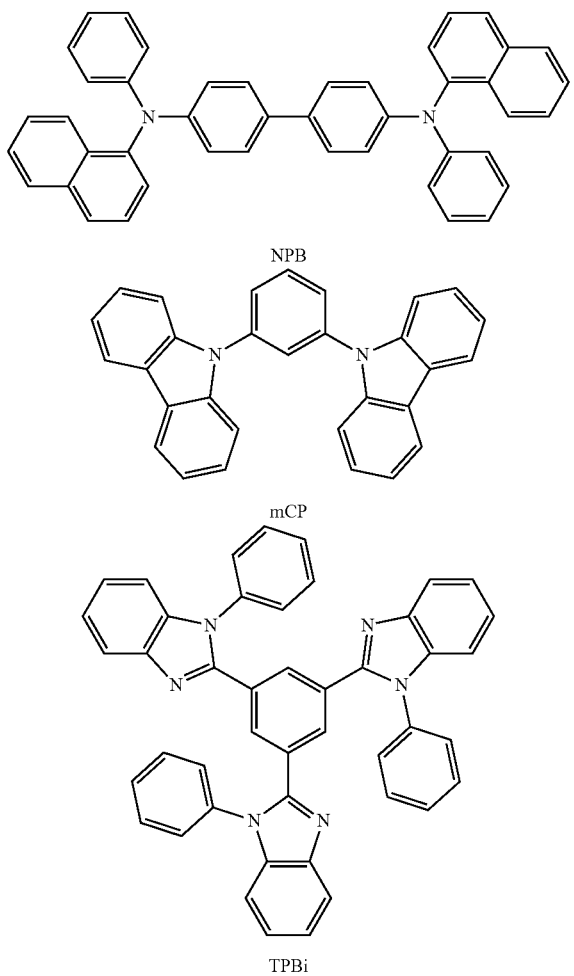

NPB mCP

TPBi (Evaluation of Properties of Organic Electroluminescence Devices)

The evaluation results of the organic electroluminescence devices in Example 1 to Example 4, and Comparative Example 1 are shown in Table 3. In Table 3, the driving voltage, emission efficiency, maximum emission wavelength and color coordinate of the organic electroluminescence devices thus manufactured are compared and shown.

The evaluation results of the properties on the voltage and current density for the Examples and the Comparative Example, shown in Table 3 were measured using a brightness photometer PR650 while supplying a power from a Sourcemeter (Kethley Instrument Co., SMU 236).

In Table 3, the emission efficiency represents the maximum external quantum efficiency, and the emission wavelength represents the wavelength where the maximum luminance value is shown in an emission peak. Meanwhile, the color coordinate represents CIE 1976 color coordinate.

TABLE 3

| Device manu-facturing example | Emission layer dopant material | Driving voltage (V) | Emission efficiency (%) | Emission wave-length (nm) | Color coordinate CIEx | CIEy |
|---|---|---|---|---|---|---|
| Example 1 | Compound 1 | 4.5 | 15.2 | 446 | 0.15 | 0.11 |
| Example 2 | Compound 2 | 4.5 | 18.9 | 451 | 0.16 | 0.14 |
| Example 3 | Compound 3 | 4.1 | 19.7 | 456 | 0.16 | 0.14 |
| Example 4 | Compound 4 | 4.3 | 17.3 | 458 | 0.16 | 0.15 |
| Comparative Example 1 | Comparative Compound 4 | 4.2 | 19.8 | 461 | 0.16 | 0.18 |

Referring to the results of Table 3, the Examples of the organic electroluminescence devices using the compound according to an embodiment of the inventive concept as a material for an emission layer showed similar driving voltage values and excellent emission efficiency when compared with the Comparative Example. In addition, it could be found that the emission central wavelength of the Examples is about 460 nm or less and emitted light in a blue wavelength region.

In the color coordinate results, the CIEy values of Example 1 to Example 4 were smaller when compared with that of Comparative Example 1, and it could be found that the color purity of blue light is improved for the Examples.

The compounds of embodiments introduce substituents at both sides of a sulfonyl group and has an asymmetric structure, and energy between an electron donor and an electron acceptor is actively controlled and TADF properties are maintained. In addition, improved color purity properties may be shown when compared with a case using Comparative Compound C1, which has a symmetry structure.

The organic electroluminescence device of an embodiment includes the compound of an embodiment and may show excellent emission efficiency properties and improved color purity properties. In addition, since the organic electroluminescence device of an embodiment includes the compound of an embodiment as a material for an emission layer, excellent emission efficiency in a blue light wavelength region and excellent color quality may be achieved.

The organic electroluminescence device of an exemplary embodiment of the inventive concepts may show device properties including excellent emission efficiency and color purity.

The compound of an exemplary embodiment of the inventive concepts has an asymmetric compound structure on both sides with respect to a sulfonyl group, and if the compound is used in an emission layer of an organic electroluminescence device, the color purity of the organic electroluminescence device may be improved.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:
1. An organic electroluminescence device, comprising:
a first electrode;
a second electrode disposed on the first electrode; and
a plurality of organic layers disposed between the first electrode and the second electrode,
wherein at least one organic layer among the organic layers comprises a compound represented by Formula 1:

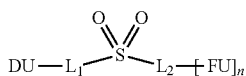

[Formula 1]

wherein in Formula 1,
$L_1$ and $L_2$ are each independently a substituted or unsubstituted arylene group of 6 to 30 carbon atoms for forming a ring,
"n" is 0 or 1,
FU is a deuterium atom, a halogen atom, a cyano group, an amino group, a substituted or unsubstituted alkyl group of 1 to 10 carbon atoms, a substituted or unsubstituted alkoxy group of 1 to 10 carbon atoms, a substituted or unsubstituted aryloxy group of 6 to 30 carbon atoms for forming a ring, a substituted or unsubstituted alkylamine group of 1 to 10 carbon atoms, a substituted or unsubstituted arylamine group of 6 to 30 carbon atoms for forming a ring, or a substituted or unsubstituted piperidine group,
FU and DU are different from each other, and
DU is represented by Formula 2:

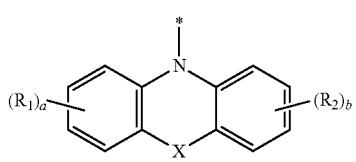

[Formula 2]

wherein in Formula 2,
X is a direct linkage, O, S, or $CR_aR_b$,
$R_a$ and $R_b$ are each independently a hydrogen atom, a deuterium atom, a substituted or unsubstituted alkyl group of 1 to 10 carbon atoms, or a substituted or unsubstituted aryl group of 6 to 30 carbon atoms for forming a ring, or combined with an adjacent group to form a ring,
$R_1$ and $R_2$ are each independently a hydrogen atom, a deuterium atom, a halogen atom, a substituted or unsubstituted alkyl group of 1 to 10 carbon atoms, a substituted or unsubstituted alkylamine group of 1 to 10 carbon atoms, a substituted or unsubstituted arylamine group of 6 to 30 carbon atoms for forming a ring, a substituted or unsubstituted aryl group of 6 to 30 carbon atoms for forming a ring, or a substituted or unsubstituted heteroaryl group of 2 to 30 carbon atoms for forming a ring, or combined with an adjacent group to form a ring, and
"a" and "b" are each independently an integer of 0 to 4, and
wherein $L_2$ is an unsubstituted phenylene group when n is 0.

2. The organic electroluminescence device of claim 1, wherein the organic layers comprise:
an emission layer;
a hole transport region disposed between the first electrode and the emission layer; and
an electron transport region disposed between the emission layer and the second electrode,
wherein the emission layer comprises the compound represented by Formula 1.

3. The organic electroluminescence device of claim 2, wherein the emission layer emits delayed fluorescence.

4. The organic electroluminescence device of claim 2, wherein the emission layer is a delayed fluorescence emission layer comprising a host and a dopant, and
the dopant comprises the compound represented by Formula 1.

5. The organic electroluminescence device of claim 2, wherein the emission layer emits blue light.

6. The organic electroluminescence device of claim 1, wherein Formula 1 is represented by Formula 1-1:

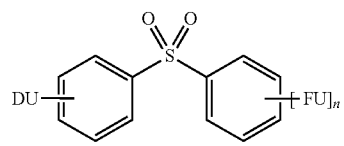

[Formula 1-1]

wherein in Formula 1-1, "n", FU, and DU are the same as defined in Formula 1.

7. The organic electroluminescence device of claim 1, wherein Formula 1 is represented by Formula 1-2:

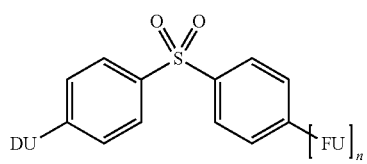

[Formula 1-2]

wherein in Formula 1-2, "n", FU, and DU are the same as defined in Formula 1.

8. The organic electroluminescence device of claim 1, wherein Formula 2 is represented by any one among the following D1 to D5:

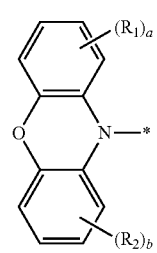

D1

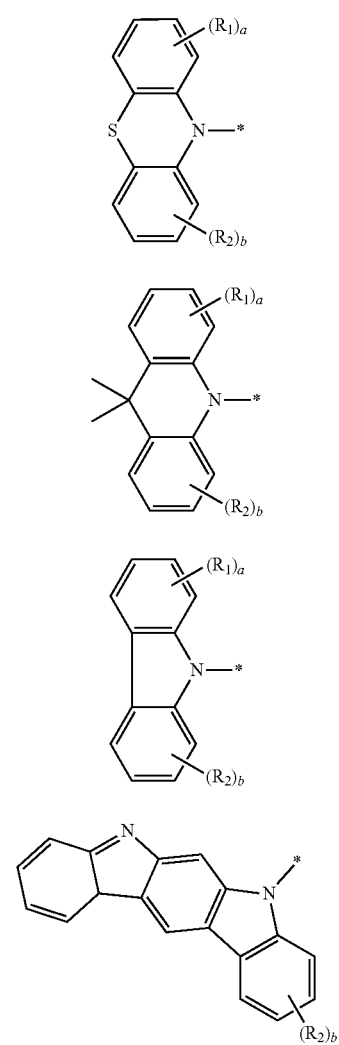
wherein in D1 to D5, $R_1$, $R_2$, "a" and "b" are the same as defined in Formula 2.
9. The organic electroluminescence device of claim 1, wherein the compound represented by Formula 1 comprises at least one among compounds in the following Compound Group 1:
[Compound Group 1]
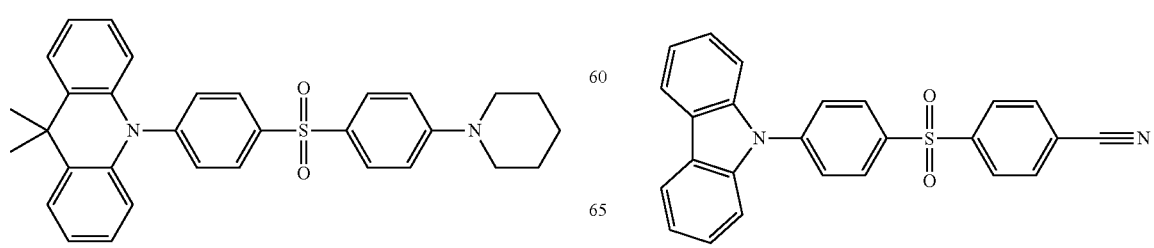
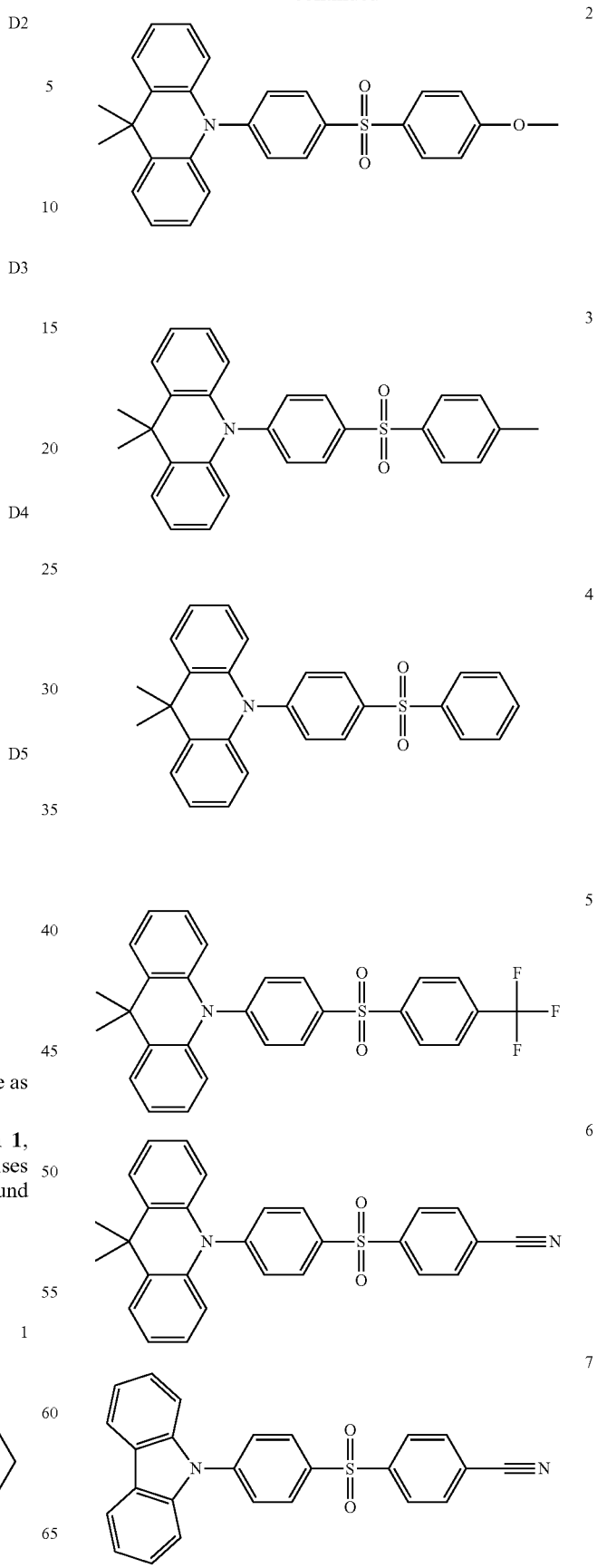

-continued

8

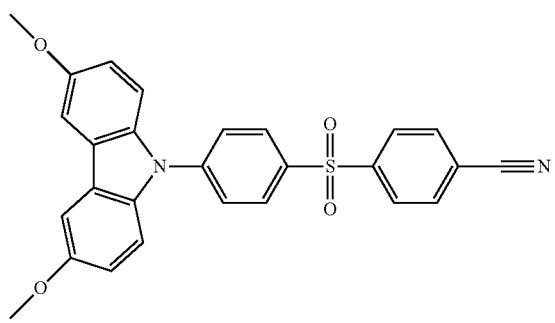

9

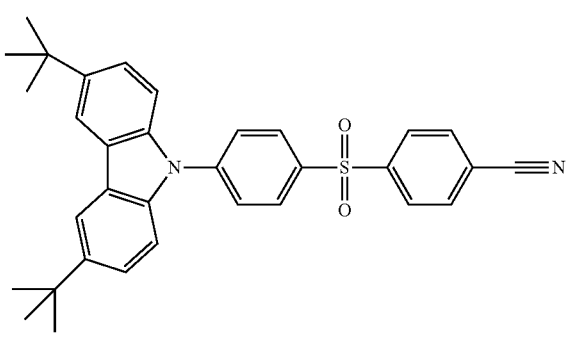

10

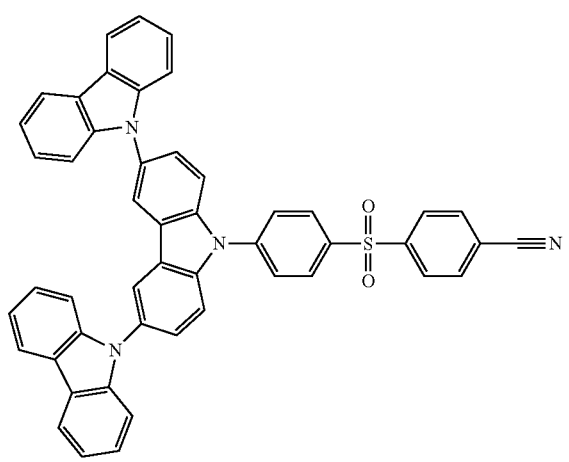

10. A compound represented by Formula 1:

[Formula 1]

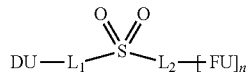

wherein in Formula 1, $L_1$ and $L_2$ are each independently a substituted or unsubstituted arylene group of 6 to 30 carbon atoms for forming a ring, "n" is 0 or 1, FU is a deuterium atom, a halogen atom, a cyano group, an amino group, a substituted or unsubstituted alkyl group of 1 to 10 carbon atoms, a substituted or unsubstituted alkoxy group of 1 to 10 carbon atoms, a substituted or unsubstituted aryloxy group of 6 to 30 carbon atoms for forming a ring, a substituted or unsubstituted alkylamine group of 1 to 10 carbon atoms, a substituted or unsubstituted arylamine group of 6 to 30 carbon atoms for forming a ring, or a substituted or unsubstituted piperidine group, FU and DU are different from each other, and DU is represented by Formula 2:

[Formula 2]

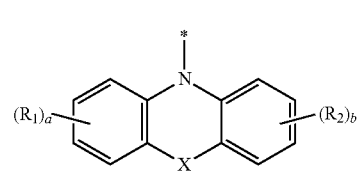

wherein in Formula 2,

X is a direct linkage, O, S, or $CR_aR_b$, $R_a$ and $R_b$ are each independently a hydrogen atom, a deuterium atom, a substituted or unsubstituted alkyl group of 1 to 10 carbon atoms, or a substituted or unsubstituted aryl group of 6 to 30 carbon atoms for forming a ring, or combined with an adjacent group to form a ring, $R_1$ and $R_2$ are each independently a hydrogen atom, a deuterium atom, a halogen atom, a substituted or unsubstituted alkyl group of 1 to 10 carbon atoms, a substituted or unsubstituted alkylamine group of 1 to 10 carbon atoms, a substituted or unsubstituted arylamine group of 6 to 30 carbon atoms for forming a ring, a substituted or unsubstituted aryl group of 6 to 30 carbon atoms for forming a ring, or a substituted or unsubstituted heteroaryl group of 2 to 30 carbon atoms for forming a ring, or combined with an adjacent group to form a ring, and "a" and "b" are each independently an integer of 0 to 4, and wherein $L_2$ is an unsubstituted phenylene group when n is 0.

11. The compound of claim 10, wherein $L_1$ and $L_2$ are the same.

12. The compound of claim 10, wherein $L_1$ and $L_2$ are unsubstituted phenylene groups.

13. The compound of claim 10, wherein Formula 1 is represented by Formula 1-1:

[Formula 1-1]

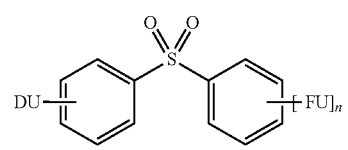

wherein in Formula 1-1, "n", FU, and DU are the same as defined in Formula 1.

14. The compound of claim 10, wherein Formula 1 is represented by Formula 1-2:

[Formula 1-2]

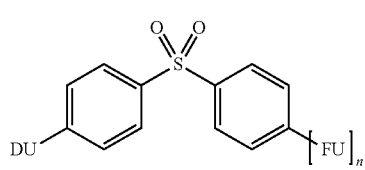

wherein in Formula 1-2, "n", FU, and DU are the same as defined in Formula 1.

15. The compound of claim 10, wherein Formula 2 is represented by any one among the following D1 to D5:

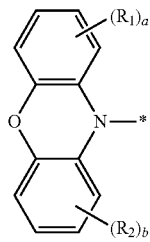
D1

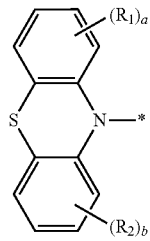
D2

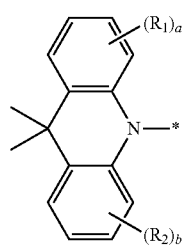
D3

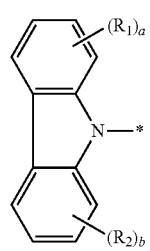
D4

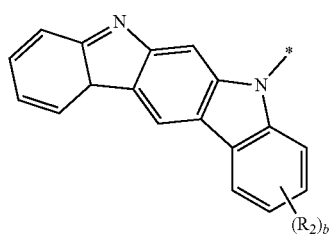
D5 wherein in D1 to D5, $R_1$, $R_2$, "a" and "b" are the same as defined in Formula 2.

16. The compound of claim 10, wherein Formula 1 is represented by Formula 1-3:

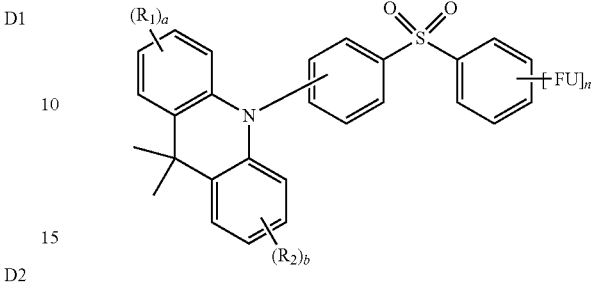
[Formula 1-3]

wherein in Formula 1-3,
"n" and FU are the same as defined in Formula 1, and $R_1$, $R_2$, "a", and "b" are the same as defined in Formula 2.

17. The compound of claim 10, wherein the compound represented by Formula 1 is a thermally activated delayed fluorescence dopant.

18. The compound of claim 10, wherein a difference between a lowest triplet excitation energy level and a lowest singlet excitation energy level of the compound represented by Formula 1 is about 0.2 eV or less.

19. The compound of claim 10, wherein the compound represented by Formula 1 may be a light-emitting material which emits light having a central wavelength of about 420 nm to about 480 nm.

20. The compound of claim 10, wherein the compound represented by Formula 1 is represented by any one among compounds in the following Compound Group 1:

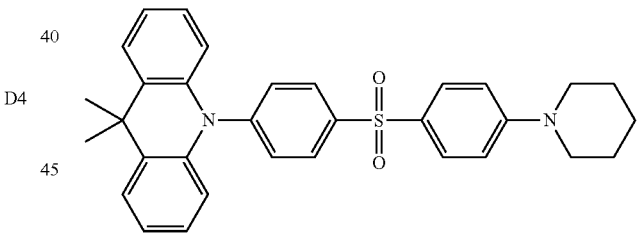
1

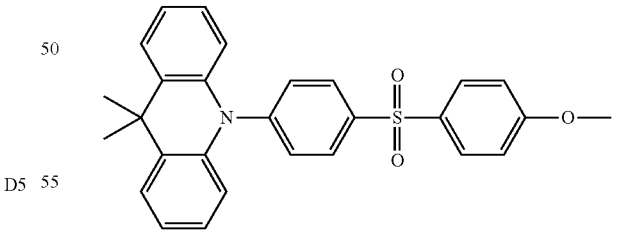
2

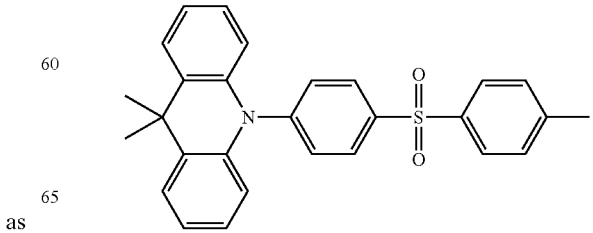
3

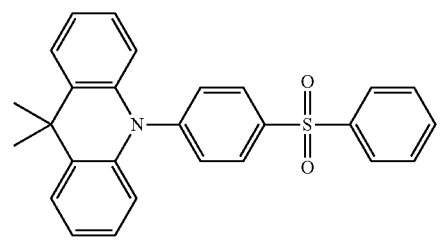
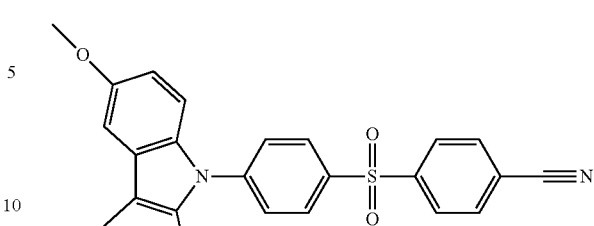
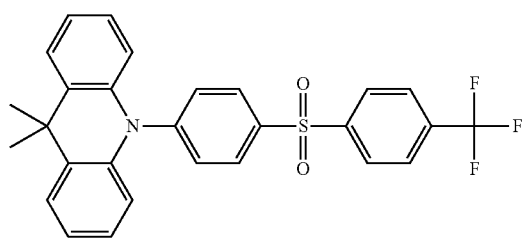
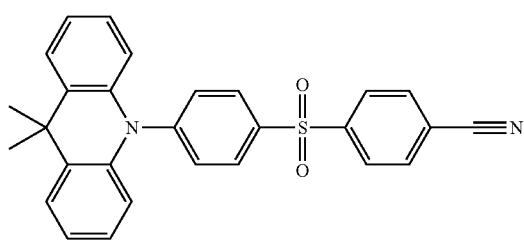
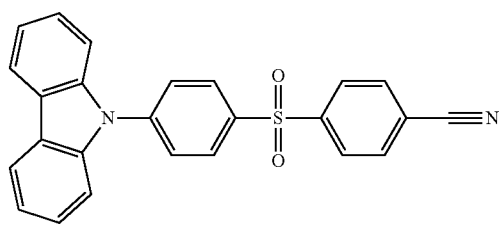
* * * * *

UNITED STATES PATENT AND TRADEMARK OFFICE
CERTIFICATE OF CORRECTION

PATENT NO. : 11,844,274 B2
APPLICATION NO. : 16/721613
DATED : December 12, 2023
INVENTOR(S) : SooYoung Park et al.

Page 1 of 1

It is certified that error appears in the above-identified patent and that said Letters Patent is hereby corrected as shown below:

In the Specification

The last entry on the left side of Table 3, Column 34, Lines 19 and 20, should be changed from "Comparative Compound 4" to "Comparative Compound C1".

Signed and Sealed this
Sixteenth Day of January, 2024

Katherine Kelly Vidal
*Director of the United States Patent and Trademark Office*